(12) United States Patent
Ishibashi et al.

(10) Patent No.: US 10,710,523 B2
(45) Date of Patent: Jul. 14, 2020

(54) UTILITY VEHICLE

(71) Applicant: KAWASAKI JUKOGYO KABUSHIKI KAISHA, Hyogo (JP)

(72) Inventors: Kazuki Ishibashi, Hyogo (JP); Itsuo Takegami, Hyogo (JP); Kazumasa Hisada, Hyogo (JP)

(73) Assignee: KAWASAKI JUKOGYO KABUSHIKI KAISHA, Hyogo (JP)

(*) Notice: Subject to any disclaimer, the term of this patent is extended or adjusted under 35 U.S.C. 154(b) by 6 days.

(21) Appl. No.: 16/031,033

(22) Filed: Jul. 10, 2018

(65) Prior Publication Data

US 2020/0017040 A1   Jan. 16, 2020

(51) Int. Cl.
| | | |
|---|---|---|
| *B60R 16/02* | (2006.01) | |
| *B60R 16/023* | (2006.01) | |
| *H05K 5/03* | (2006.01) | |
| *H05K 5/06* | (2006.01) | |
| *H05K 5/00* | (2006.01) | |

(52) U.S. Cl.
CPC ....... *B60R 16/0239* (2013.01); *H05K 5/0017* (2013.01); *H05K 5/03* (2013.01); *H05K 5/063* (2013.01); *B60Y 2200/20* (2013.01)

(58) Field of Classification Search
CPC .................................. B60R 5/047; B60R 5/04; B60R 5/045; B60R 7/02; B60R 5/044; B60R 21/06; B60R 11/00; B60R 2011/0075; H04N 5/655

USPC ... 296/37.16, 24.43, 37.14, 37.8, 63, 66, 98, 296/97.23, 65.05, 37.7; 348/837, 836, 348/E5.132, E5.128; 224/400, 539, 554, 224/558, 564, 571
See application file for complete search history.

(56) References Cited

U.S. PATENT DOCUMENTS

| | | | | |
|---|---|---|---|---|
| 8,086,376 B2* | 12/2011 | McCoy | ............... | B60R 21/0134 340/440 |
| 8,651,351 B2* | 2/2014 | Fowler | ..................... | B60R 5/04 224/281 |
| 9,849,781 B2* | 12/2017 | Itoo | ........................ | B60K 28/14 |
| 2009/0091101 A1* | 4/2009 | Leonard | ................... | B60G 3/20 280/638 |
| 2009/0184531 A1* | 7/2009 | Yamamura | ........... | B60N 2/3011 296/37.6 |
| 2010/0019539 A1* | 1/2010 | Nakamura | ........... | B62D 21/186 296/190.04 |
| 2016/0185218 A1 | 6/2016 | Itoo et al. | | |
| 2017/0274892 A1* | 9/2017 | Miyashita | ............. | B60W 20/14 |

* cited by examiner

*Primary Examiner* — D Glenn Dayoan
*Assistant Examiner* — Sunsurraye Westbrook
(74) *Attorney, Agent, or Firm* — Wenderoth, Lind & Ponack, L.L.P.

(57) ABSTRACT

A utility vehicle includes a seat, and a back panel with at least a part of the back panel located behind the seat. The back panel has a box portion that has an opening facing a cabin, and a lid covers the opening. An electrical component is housed in the box portion.

7 Claims, 23 Drawing Sheets

UTILITY VEHICLE

BACKGROUND OF THE INVENTION

1. Technical Field

The present invention relates to a utility vehicle, and more particularly to a box which houses electrical components.

2. Description of Related Art

A utility vehicle capable of performing off-road driving, such as a vehicle described in US 2016/0185218 A1, has been known. According to this type of utility vehicle, a box which houses electrical components is disposed below a front cover forward of a cabin.

However, the box disposed below the front cover comes into an environment easily exposed to water and dust. In this case, water and dust may enter the inside of the box.

SUMMARY

An object of the present invention is to reduce entrance of water and dust into a box which houses electrical components.

For achieving the above object, a utility vehicle provided according to an aspect of the present invention includes: a seat; a back panel at least a part of which is disposed behind the seat, the back panel having a portion forming a box portion that has an opening on a cabin side; a lid that covers the opening; and an electrical component housed in the box portion.

According to this aspect, entrance of water and dust into the box portion which houses the electrical component decreases.

DETAILED DESCRIPTION

A utility vehicle according to an aspect of the present invention includes a seat, a back panel at least a part of which is disposed behind the seat, the back panel having a portion forming a box portion that has an opening on a cabin side, a lid that covers the opening, and an electrical component housed in the box portion.

For example, the box portion is formed on a side wall of the back panel facing a back surface of the seat.

For example, the box portion is disposed above a seating surface of the seat.

For example, a case body fixed to an inside of the box portion is provided. The case body has an opening in a same direction as a direction of the opening of the box portion. The case body houses the electrical component. The lid covers the opening of the case body.

For example, a connection portion between the lid and the respective openings of the box portion and the case body has a labyrinth structure.

For example, a battery is disposed behind the back panel.

For example, a power unit that includes an engine and a power generator that generates power from an output of the engine is further provided. An electronic control unit (ECU) disposed within the box portion is further provided. The power unit is disposed behind the back panel.

A more detailed embodiment will be hereinafter described with reference to FIGS. 1 to 25. FIGS. 1 to 25 each illustrate a utility vehicle according to an embodiment.

Note that excessively detailed description may be omitted. For example, detailed description of well-known matters and repeated explanation on substantially the same configuration may be omitted. These omissions are made to avoid unnecessary redundancy of following description, and to help easy understanding by those skilled in the art. Similarly, some constituent elements are not shown in the respective figures to help easy understanding of positional relationships between respective constituent elements.

The inventors of the present invention provide the accompanying drawings and the following description to help those skilled in the art sufficiently understand the present disclosure. The drawings and description are therefore not intended to limit the subject matters claimed in the appended claims.

In addition, the terms "front", "rear", "left" and "right" included in the present specification are defined as viewed from a driver who sits in and drives a utility vehicle. A front-rear direction is represented by an X axis, a left-right direction corresponding to a vehicle width direction is represented by a Y axis, and a height direction corresponding to an up-down direction is represented by a Z axis.

Figure 1:
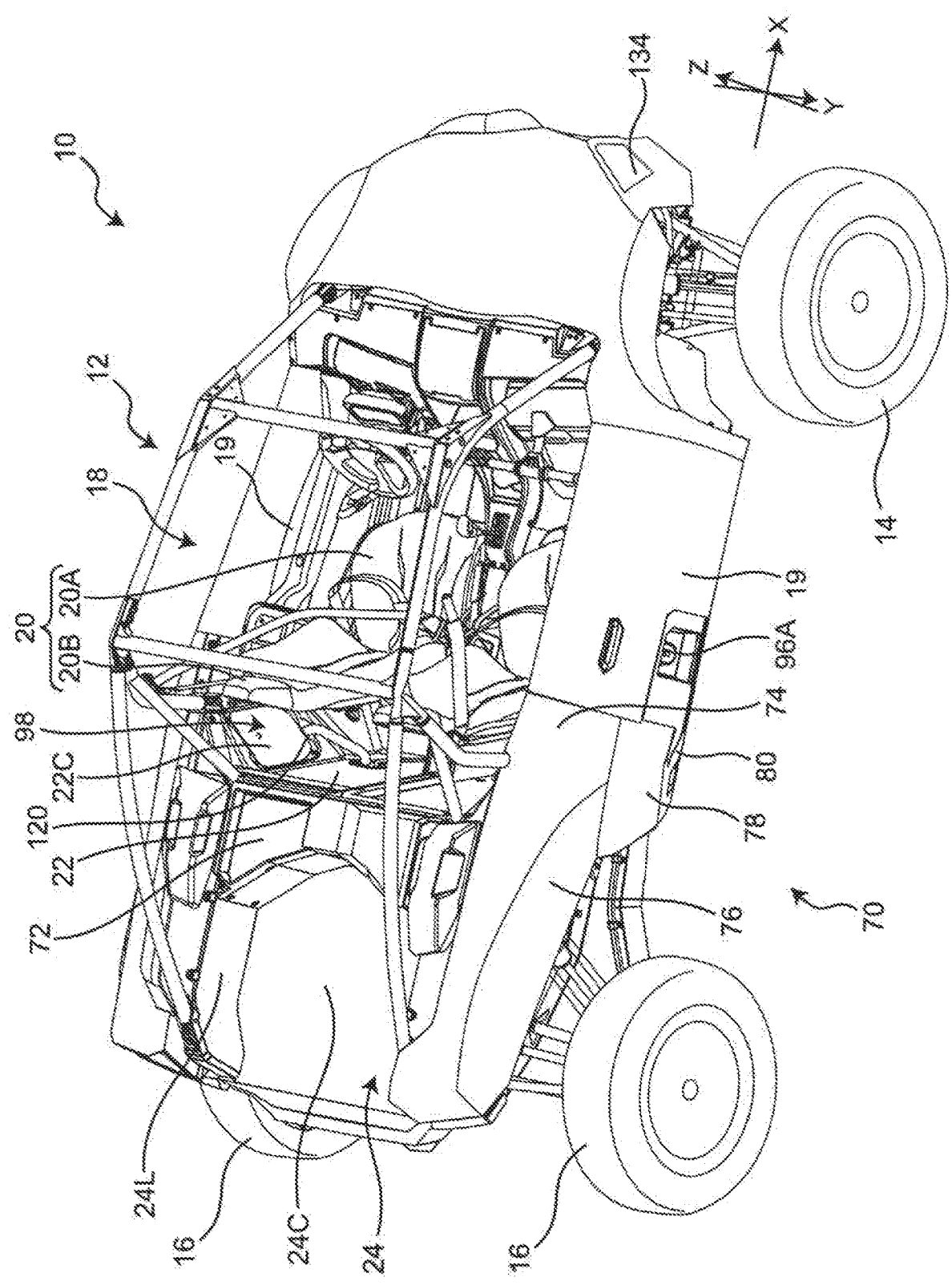
FIG. 1 is a right rear perspective view of a utility vehicle according to an embodiment.
Figure 2:
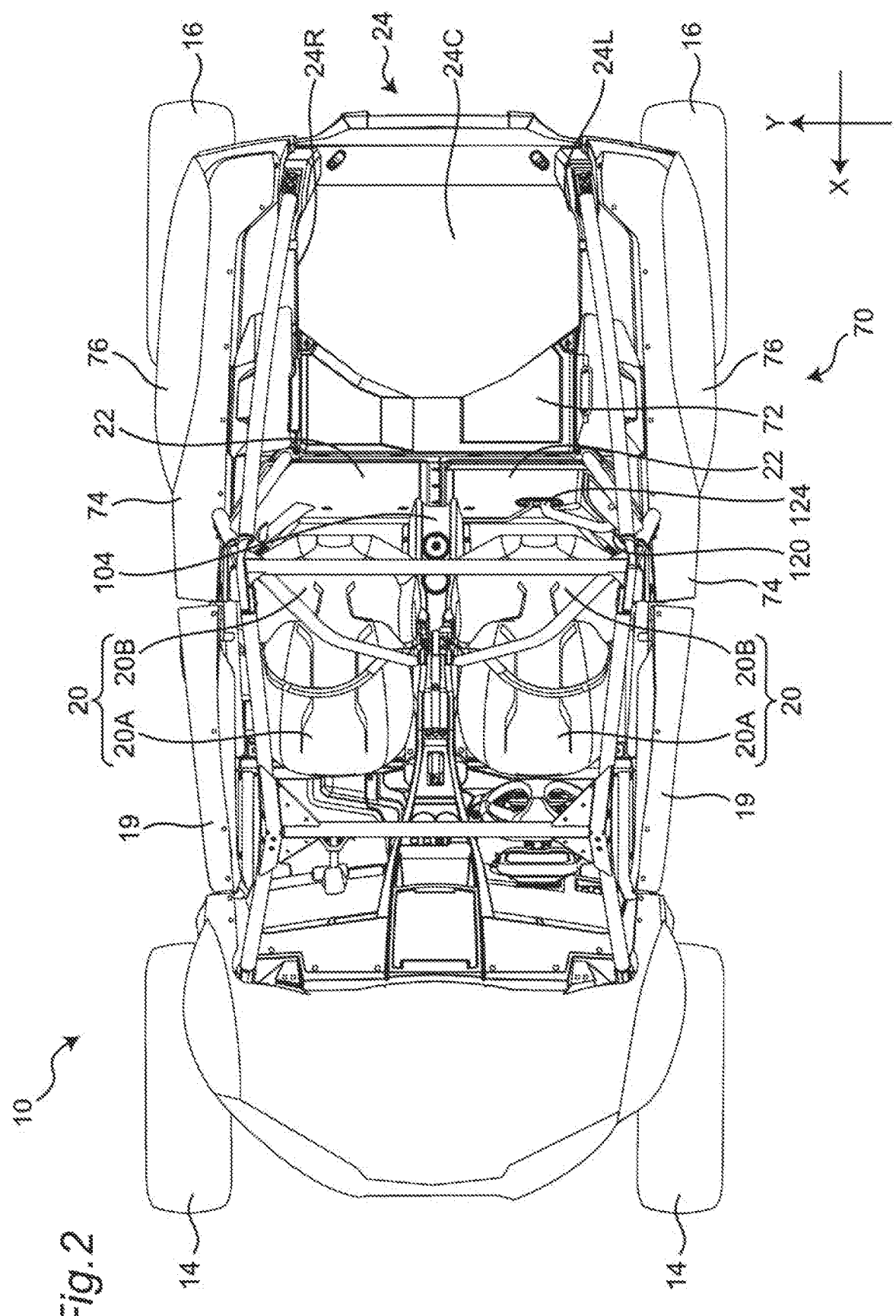
FIG. 2 is a top view of the utility vehicle.
Figure 3:
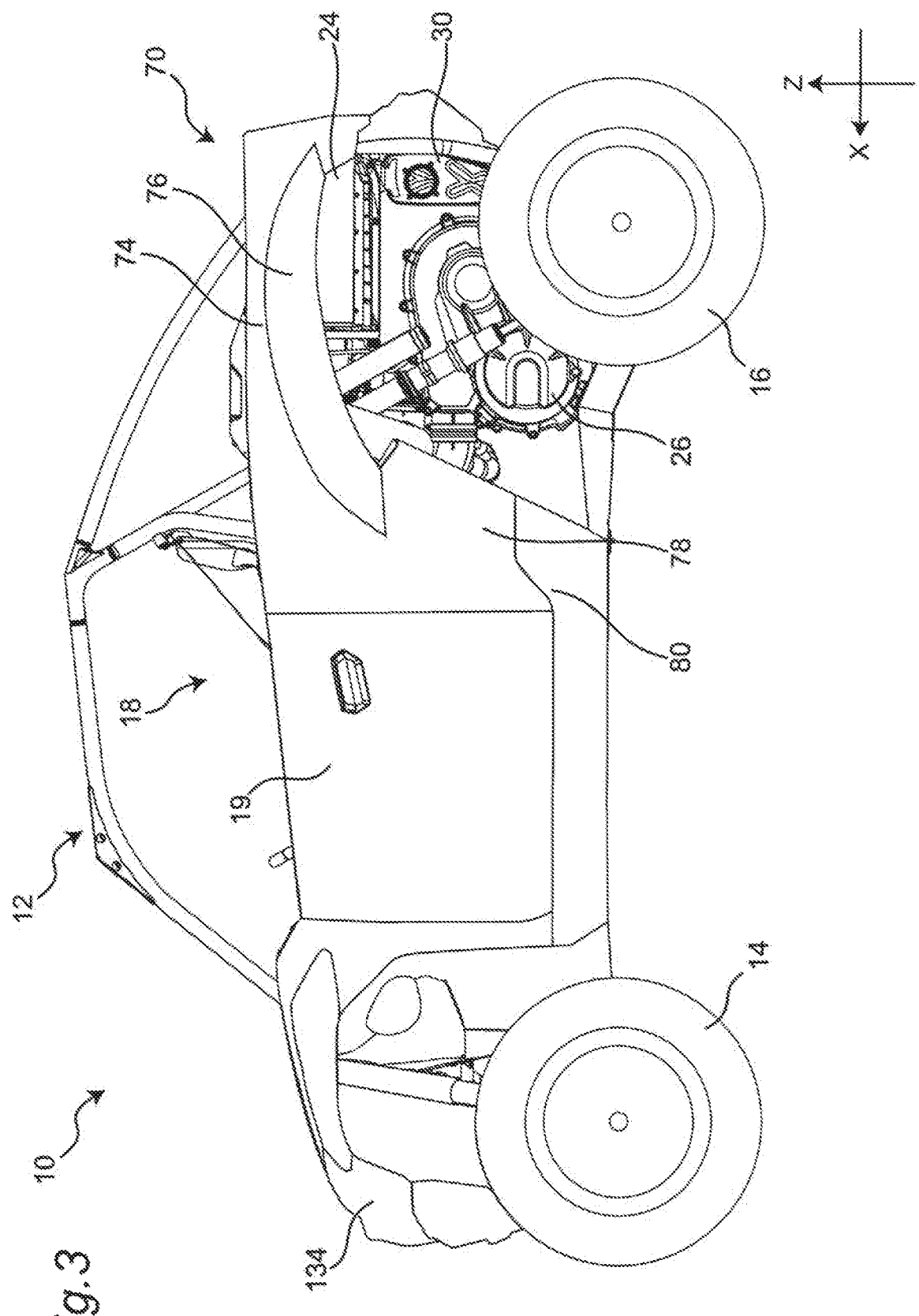
FIG. 3 is a left side view of the utility vehicle.
Figure 4:
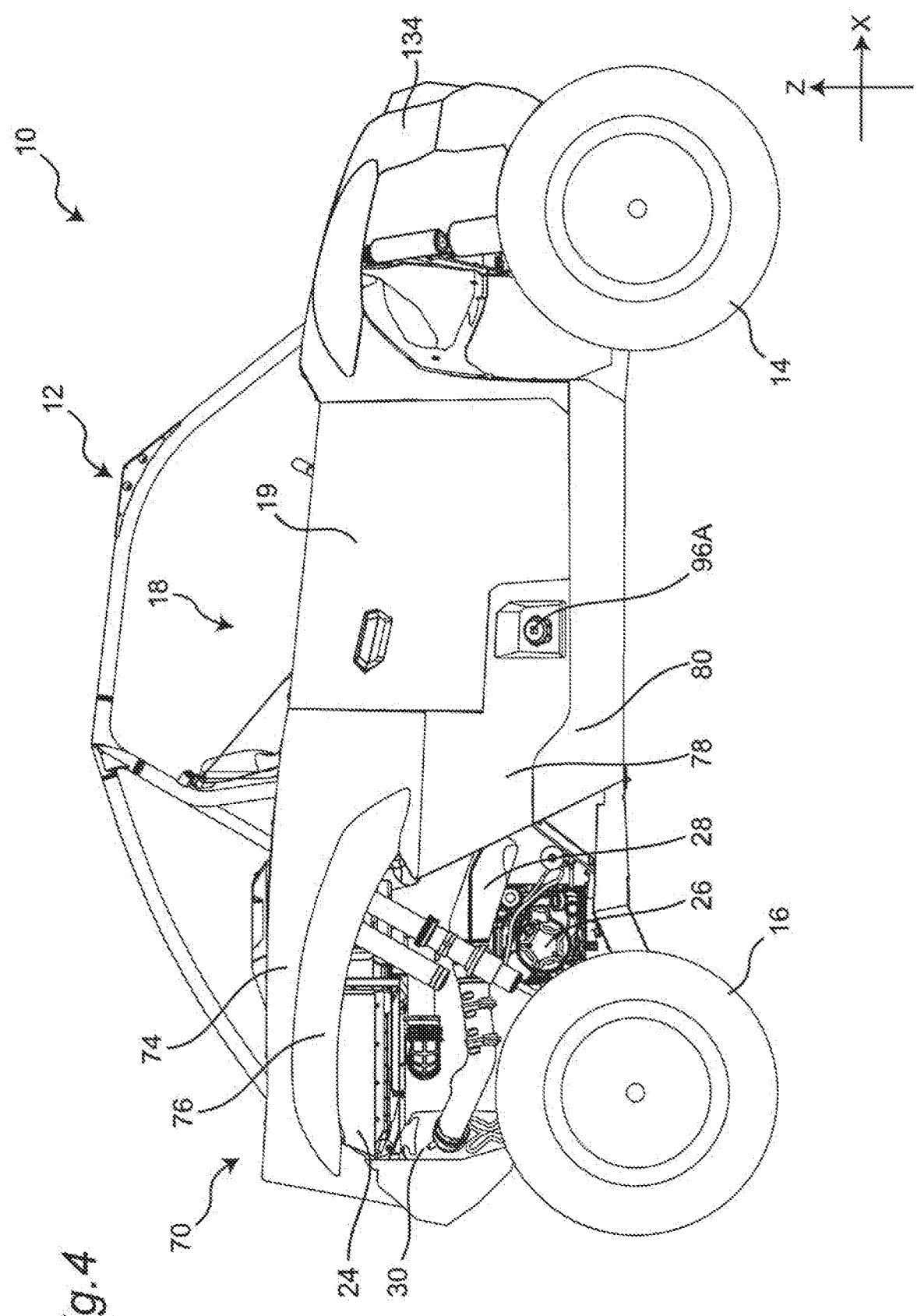
FIG. 4 is a right side view of the utility vehicle.
Figure 5:
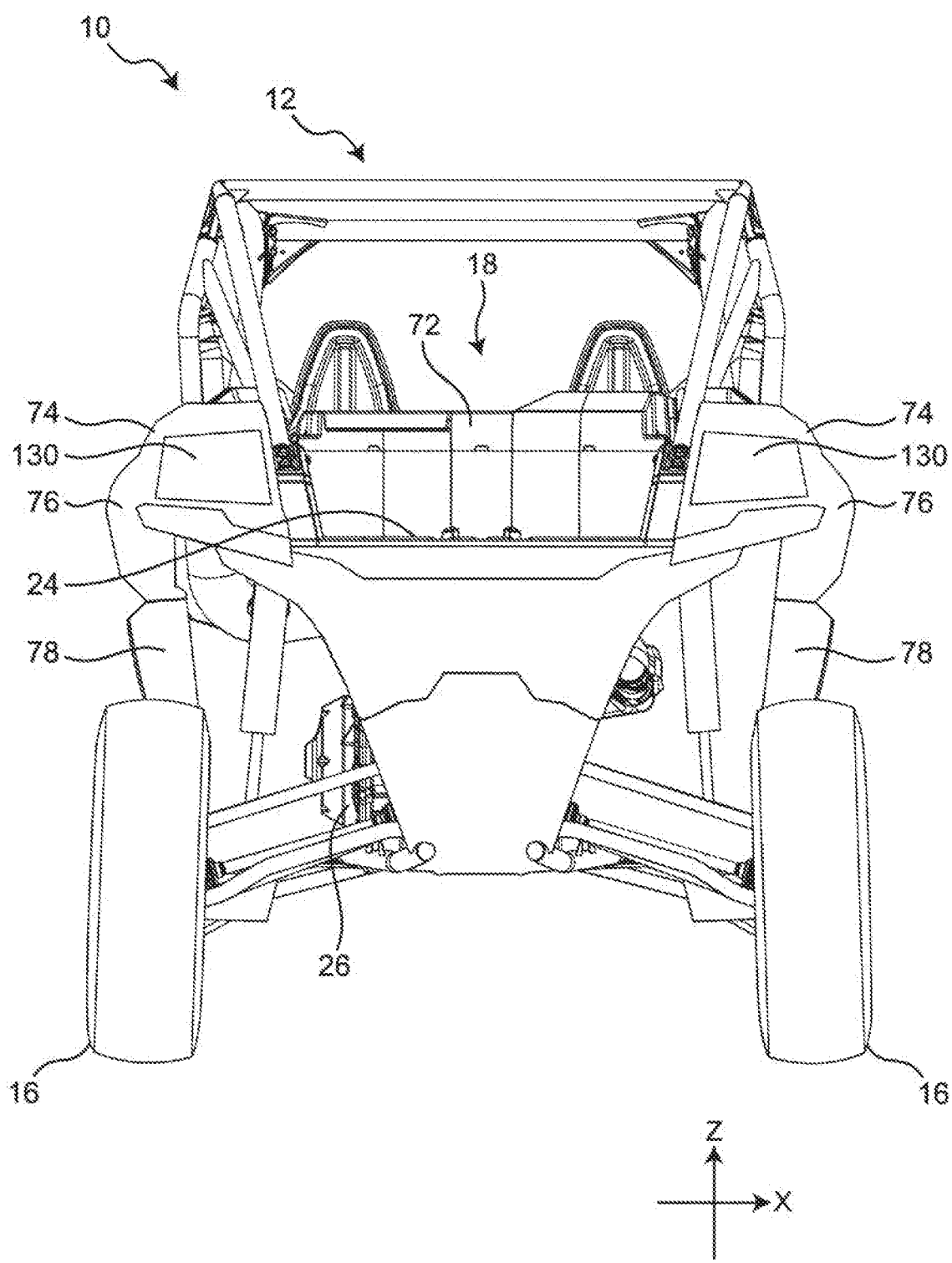
FIG. 5 is a rear view of the utility vehicle.

Refer to FIGS. 1 to 5. FIG. 1 is a right rear perspective view of a utility vehicle 10 according to an embodiment. FIG. 2 is a top view of the utility vehicle 10. FIG. 3 is a left side view of the utility vehicle. FIG. 4 is a right side view of the utility vehicle 10. FIG. 5 is a rear view of the utility vehicle 10.

As illustrated in FIGS. 1 to 5, the utility vehicle 10 includes a vehicle body frame 12, a pair of front wheels 14 and a pair of rear wheels 16 supporting the vehicle body frame 12, a cabin 18 which is a space where the driver is present, a pair of openable and closable left and right doors 19, and a seat 20 supported by the vehicle body frame 12. The utility vehicle 10 further includes a back panel 22 at least a part of which is disposed behind the seat 20, a carrier 24 disposed behind the back panel 22, a power unit 26 disposed below the carrier 24, an exhaust pipe 28 through which exhaust gas from the power unit 26 passes, and a silencer 30 connected to the exhaust pipe 28.

The seat 20 has a seat cushion 20A on which the driver and an occupant sit, and a backrest 20B which contacts the backs of the driver and the occupant.

The utility vehicle 10 includes a side cover 70 covering at least a part of the side of the vehicle body frame 12, and an upper cover 72 disposed between the back panel 22 and the carrier 24 and covering an upper side of a battery 60.

The side cover 70 includes a pair of left and right upper first side covers 74, a pair of left and right upper second side covers 76 disposed in contact with a lower portion of the upper first side covers 74, a pair of left and right middle side covers 78 disposed below the upper first side covers 74 and the upper second side covers 76, and a pair of left and right lower side covers 80 disposed below the middle side covers 78.

The carrier 24 includes a carrier left side wall portion 24L, a carrier center portion 24C on which a load is placed, and a carrier right side wall portion 24R. Respective upper surfaces of the carrier left side wall portion 24L and the carrier right side wall portion 24R extend outward.

Figure 6:
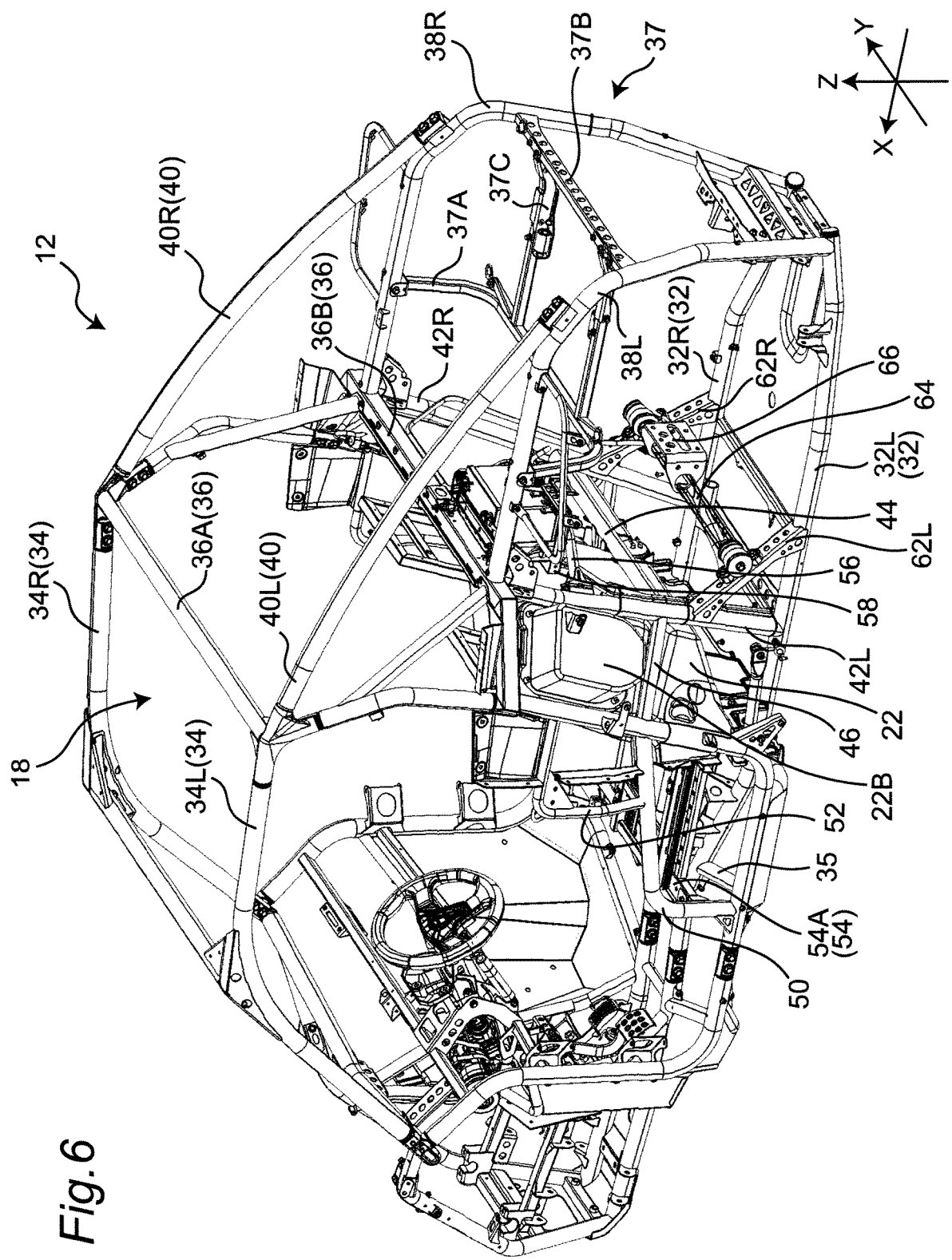
FIG. 6 is a left rear perspective view of a vehicle body frame of the utility vehicle.
Figure 7:
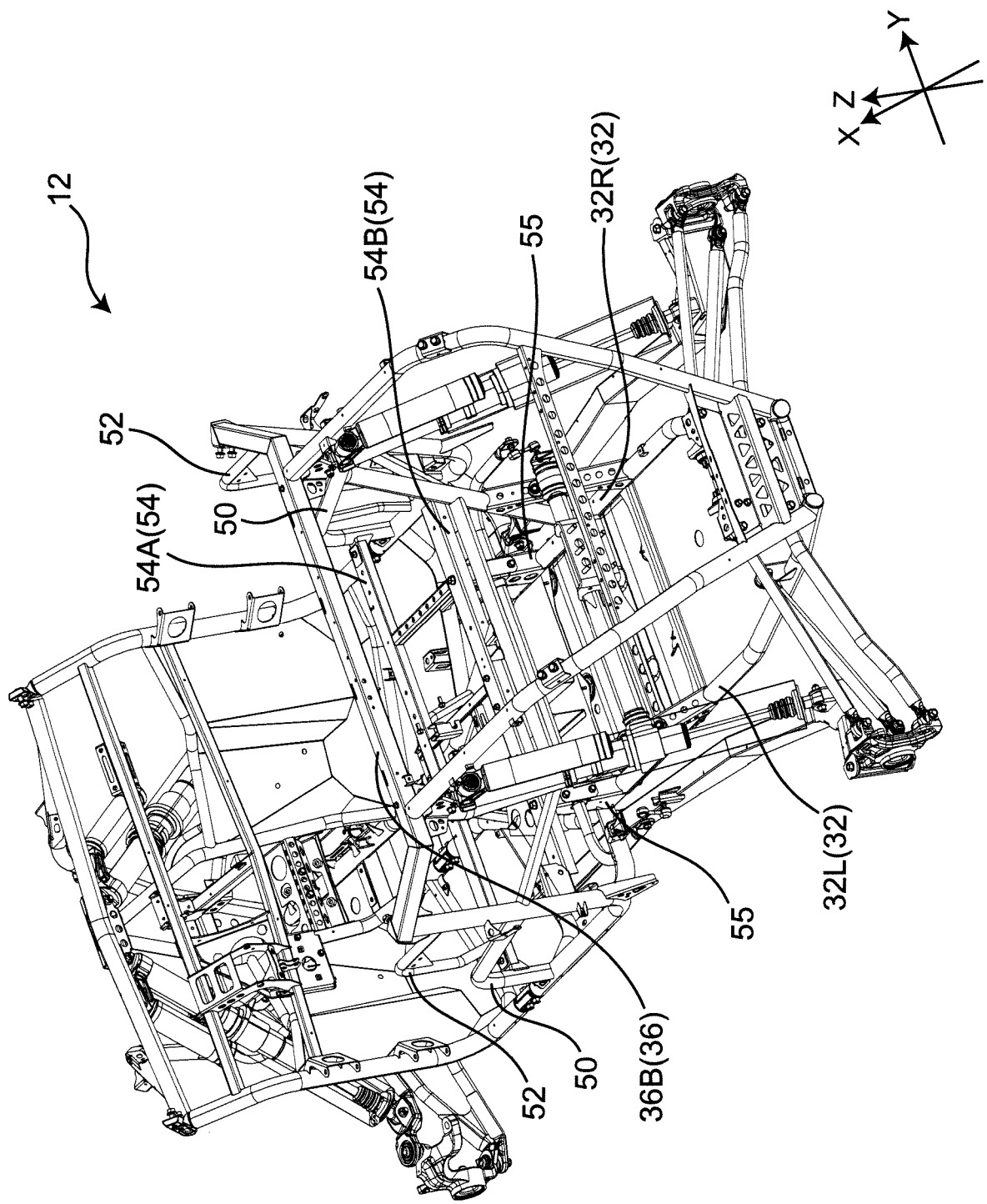
FIG. 7 is a left rear perspective view of a part of the vehicle body frame of the utility vehicle.

Now refer to FIGS. 6 and 7. FIG. 6 is a left rear perspective view of the vehicle body frame 12. FIG. 7 is a left rear perspective view of a part of the vehicle body frame of the utility vehicle. The vehicle body frame 12 includes a pair of main frames 32 extending in the front-rear direction, a rollover protective structure (ROPS) 34 surrounding the cabin 18, a cross member 36 connecting the pair of main frames 32, and a carrier frame 37 supporting the carrier 24.

The main frame 32 includes a left main frame 32L and a right main frame 32R. The ROPS 34 includes a left ROPS 34L and a right ROPS 34R. In the vehicle width direction (Y direction) of the utility vehicle 10, the left ROPS 34L is disposed outside the left main frame 32L, while the right ROPS 34R is disposed outside the right main frame 32R. The left ROPS 34L and the left main frame 32L, and the right ROPS 34R and the right main frame 32R are respectively connected by a sub frame 35.

The cross member 36 includes an upper cross member 36A connecting a rear upper portion of the left ROPS 34L and a rear upper portion of the right ROPS 34R, and a middle cross member 36B connecting a rear middle portion of the left ROPS 34L and a rear middle portion of the right ROPS 34R. The middle cross member 36B has a U shape protruding rearward.

The vehicle body frame 12 further includes a left L-shaped frame 38L connected to the middle cross member 36B and rear end of the left main frame 32L, and a right L-shaped frame 38R connected to the middle cross member 36B and rear end of the right main frame 32R. The vehicle body frame 12 further includes a left rear frame 40L connecting connection points between the left ROPS 34L and the upper cross member 36A, with rear upper portions of the left L-shaped frame 38L, and a right rear frame 40R connecting connection points between the right ROPS 34R and the upper cross member 36A, with rear upper portions of the right L-shaped frame 38R. The vehicle body frame 12 further includes a left vertical pipe 42L connected to the middle cross member 36B and the left main frame 32L, and a right vertical pipe 42R connected to the middle cross member 36B and the right main frame 32R.

The vehicle body frame 12 further includes a cross member 44 connected to the left vertical pipe 42L and the right vertical pipe 42R, a sub frame 46 connected to the left vertical pipe 42L and the left ROPS 34L, and a sub frame 48 (see FIG. 17) connected to the right vertical pipe 42R and the right ROPS 34R.

The carrier frame 37 includes a U-shaped carrier frame 37A and a rear cross member 37B respectively connected to the left L-shaped frame 38L and the right L-shaped frame 38R, and a pair of carrier bottom frames 37C connected to the U-shaped carrier frame 37A and the rear cross member 37B. One end of the U-shaped carrier frame 37A is connected between a connection portion between the left L-shaped frame 38L and the middle cross member 36B, and a connection portion between the left L-shaped frame 38L and the left rear frame 40L. The other end of the U-shaped carrier frame 37A is connected between a connection portion between the right L-shaped frame 38R and the middle cross member 36B, and a connection portion between the right L-shaped frame 38R and the right rear frame 40R. The U-shaped carrier frame 37A has a U shape protruding downward. The rear cross member 37B is connected to the left L-shaped frame 38L and the right L-shaped frame 38R behind the connection portion between the left L-shaped frame 38L and the left rear frame 40L and the connection portion between the right L-shaped frame 38R and the right rear frame 40R.

The vehicle body frame 12 further includes a pair of hip guard pipes 50 connected to respective rear lower portions of the pair of ROPS 34, a shoulder guard pipe 52 connecting respective upper portions of the pair of hip guard pipes 50 and the pair of ROPS 34, and a seat frame 54 supporting the seat 20. The seat frame 54 includes a front seat frame 54A and a rear seat frame 54B. Both ends of the front seat frame 54A are respectively connected to the pair of hip guard pipes 50. The rear seat frame 54B is connected to the pair of main frames 32 via a vertical pipe.

The vehicle body frame 12 further includes a bracket 56 extending inward in the vehicle width direction from the left vertical pipe 42L. The utility vehicle 10 includes the battery 60 supported by the bracket 56 via a support plate 58. A back panel 22 made of resin is supported by the middle cross member 36B and the cross member 44.

The vehicle body frame 12 further includes a pipe 62L connected to the left main frame 32L and a lower portion of the left vertical pipe 42L, a pipe 62R connected to the right main frame 32R and a lower portion of the right vertical pipe 42R, a pipe 64 connected to middle portions of the pipe 62L and the pipe 62R, and a bracket 66 connected to the pipe 64. The power unit 26 is fixed to the bracket 66.

Figure 8:
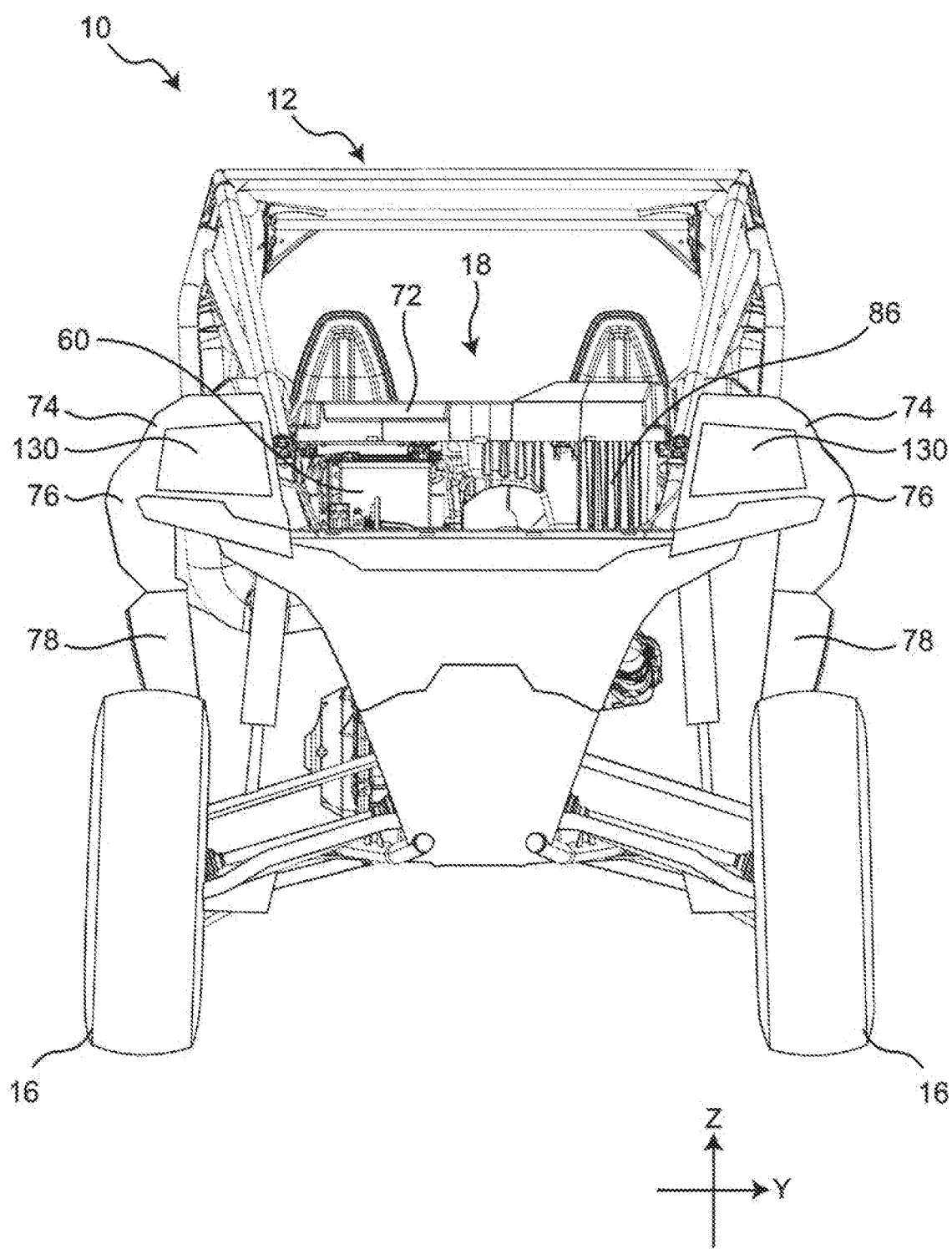
FIG. 8 is a rear view of the utility vehicle from which a carrier is removed.

FIG. 8 is a rear view of the utility vehicle 10 from which the carrier 24 is removed. An air cleaner box 86 is disposed on the side opposite to the battery 60 in the vehicle width direction.

As illustrated in FIG. 8, the upper first side cover 74 and the upper second side cover 76 disposed outside the battery 60 in the vehicle width direction cover the outside of the battery 60. The upper cover 72 covers an upper portion of the battery 60. The cover covering the outside and the upper portion of the battery 60 in this manner can protect the battery 60 from water, rain, and dust flying from above and outside.

Figure 9:
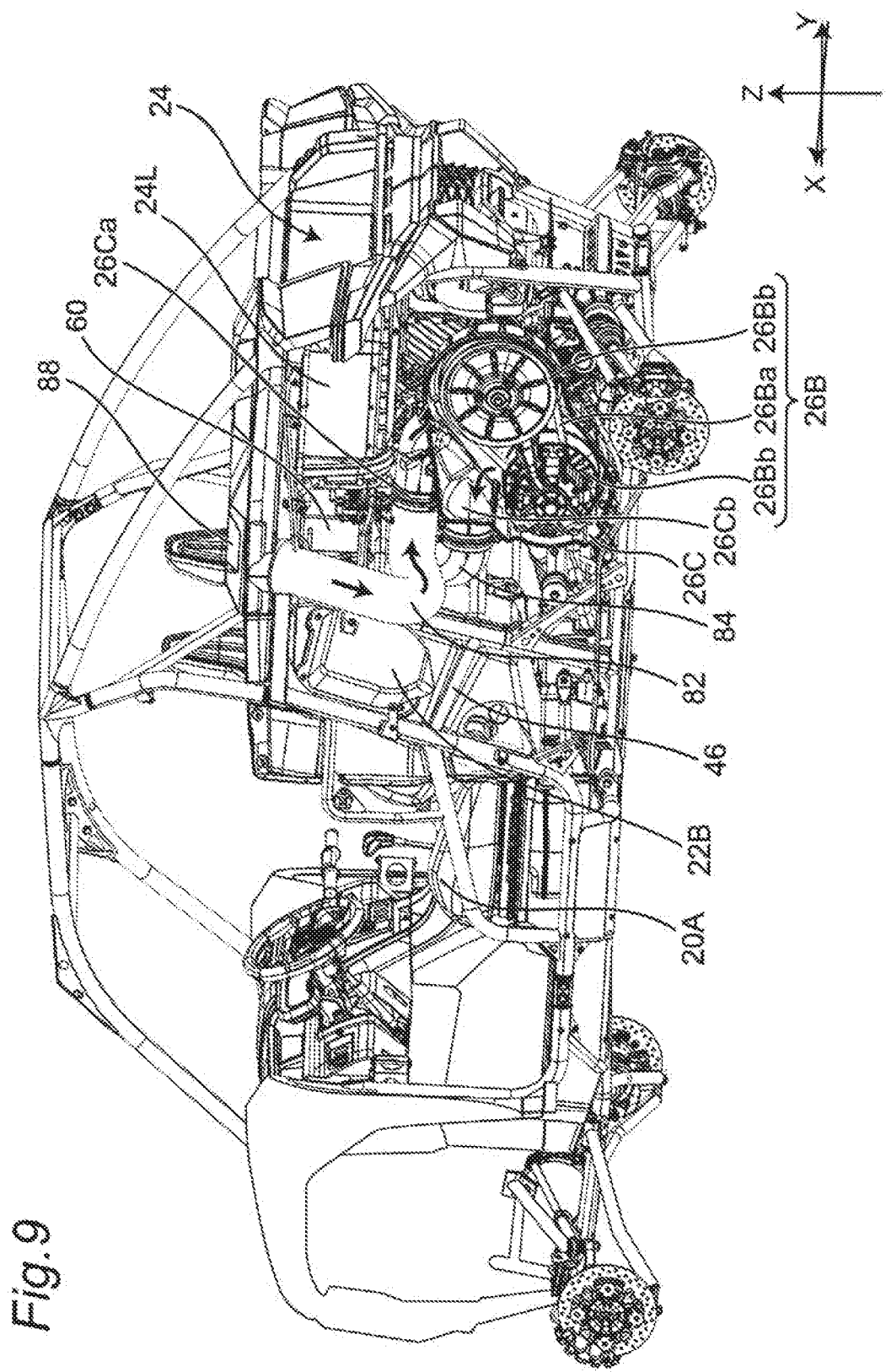
FIG. 9 is a left rear perspective view of the utility vehicle from which a left side cover and a transmission chamber left cover are removed.

Now Refer to FIG. 9. FIG. 9 is a left rear perspective view of the utility vehicle 10 from which the front wheels 14, the rear wheels 16, the side cover 70, and the doors 19 are removed. The power unit 26 includes an engine 26A, a transmission 26B that changes a rotation number of an output from the engine 26A, a transmission chamber 26C that houses the transmission 26B, and a power generator 26D that generates electric power using power of the engine 26A. The utility vehicle 10 includes a first pipe 82 that feeds the outside air to the transmission chamber 26C, and a second pipe 84 that discharges air from the transmission chamber 26C.

The transmission 26B is a continuously variable transmission mechanism (CVT), for example. A belt 26Ba is stretched between two pulleys 26Bb. A flow of air is generated within the transmission chamber 26C in a rotation direction of the belt 26Ba.

One end of the first pipe 82 is connected to an air intake port formed in the upper surface of the carrier left side wall portion 24L. The outside air is introduced from this air intake port. The periphery of the air intake port is covered by a left air intake cover 88. The first pipe 82 is extended downward on the outside of the battery 60 in the vehicle width direction from the air intake port, bent inward in the vehicle width direction, extended below the battery 60, further bent rearward, and connected to an air intake port 26Ca of the transmission chamber 26C.

In this case, the first pipe 82 through which the outside air passes is disposed outside and below the battery 60. Accordingly, an ambient temperature of the battery 60 whose upper side and outside are covered by the cover can decrease.

The outside air having entered the transmission chamber 26C circulates within the transmission chamber 26C in accordance with rotation of the belt 26Ba to cool the transmission 26B. The air having circulated is exhausted from an air outlet port 26Cb of the transmission chamber 26C to the second pipe 84.

Figure 10:
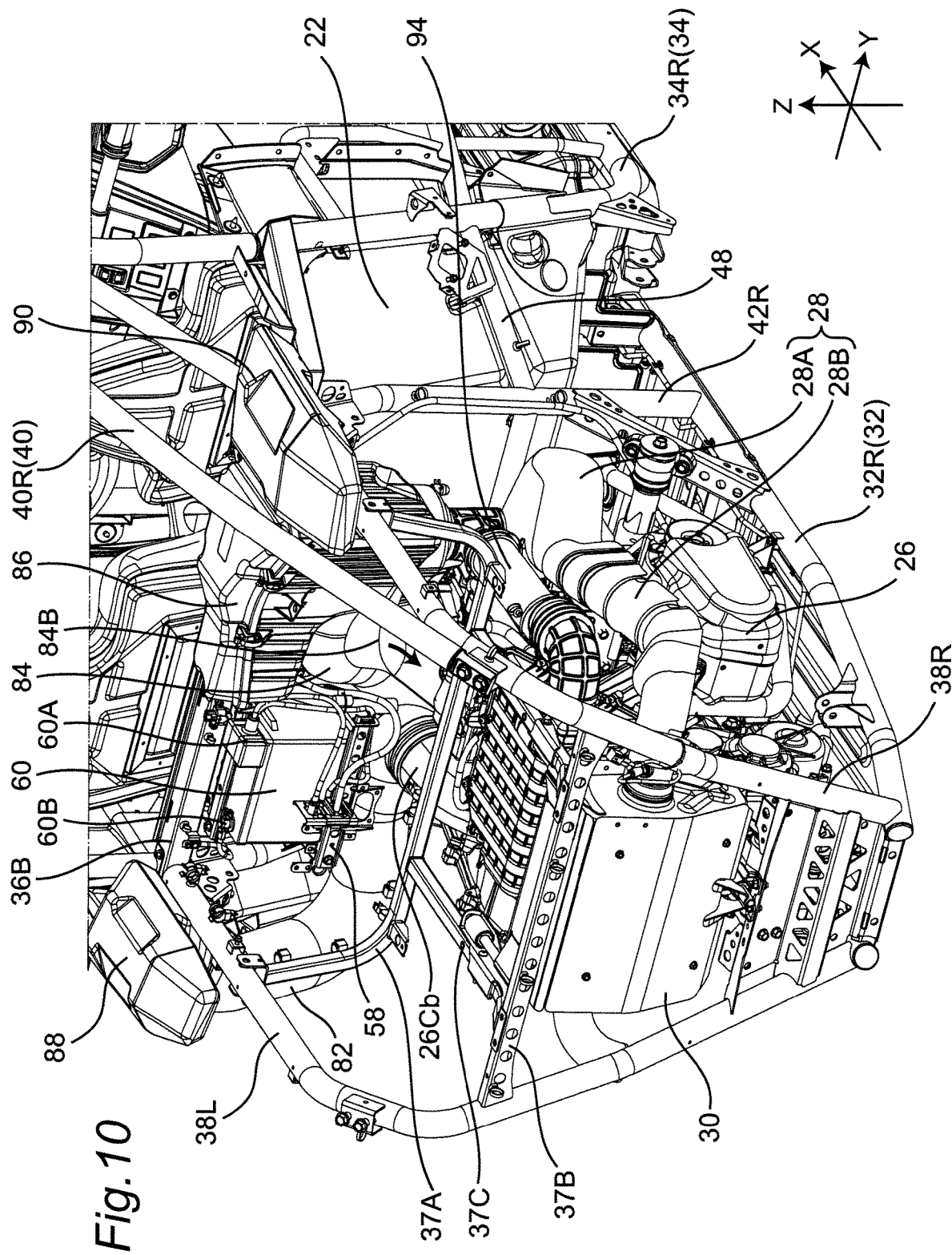
FIG. 10 is a right rear perspective view of a main part around a battery and a power unit.
Figure 11:
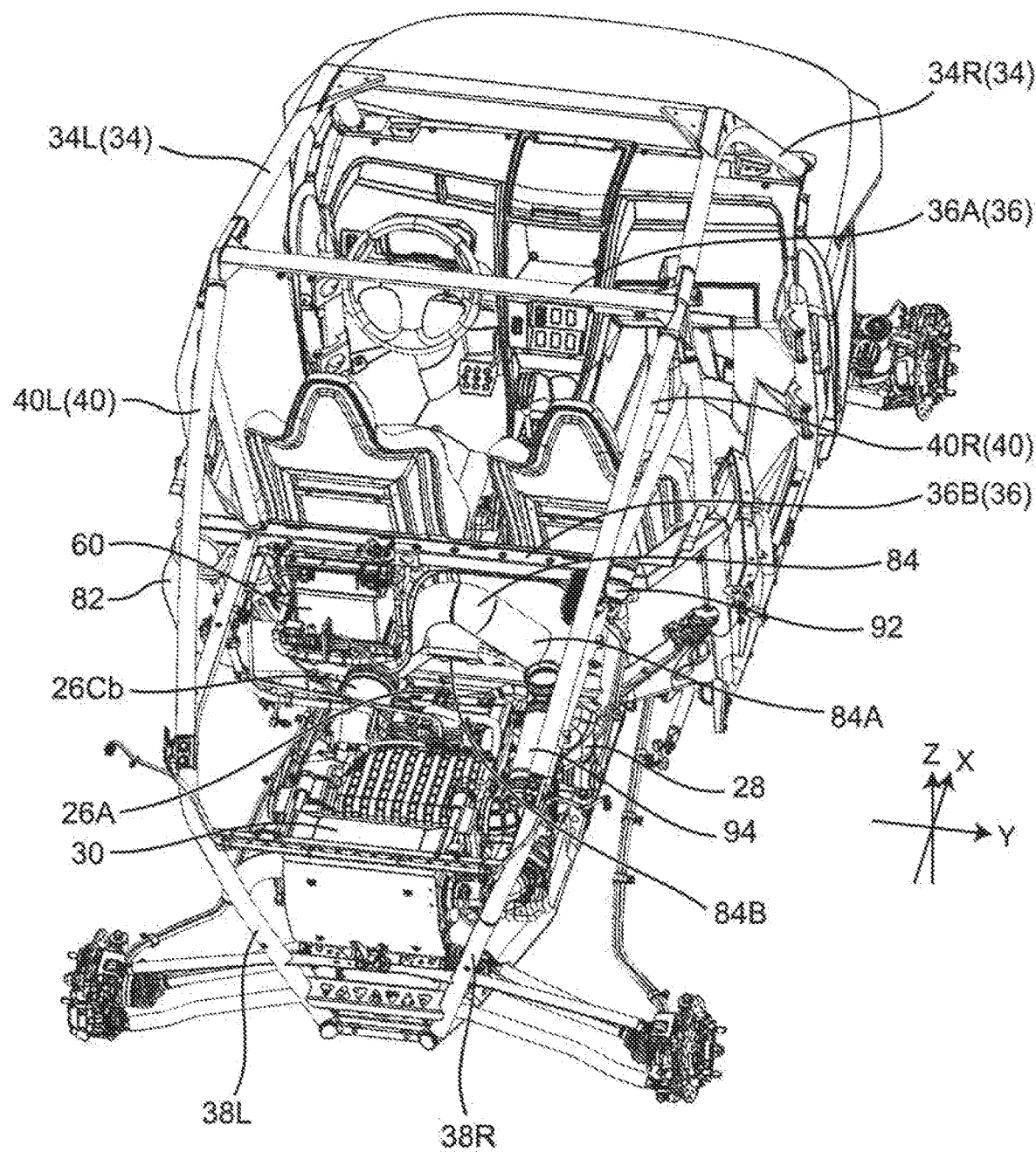
FIG. 11 is a right rear perspective view of the utility vehicle, illustrating an area around the power unit from which wheels and an air cleaner box are removed.

Refer to FIGS. 10 and 11. FIG. 10 is a right rear perspective view of a main part around the battery 60 and the power unit 26. FIG. 11 is a right rear perspective view of the utility vehicle 10, illustrating an area around the power unit 26 from which the air cleaner box 86 is removed. The second pipe 84 includes a first air outlet port 84A extended upward and transversely inward of the battery 60 from the transmission chamber 26C, then bent toward the air cleaner box 86, and opened to the exhaust pipe 28, and further includes a second air outlet port 84B opened to the engine 26A.

Air flowing from the second air outlet port 84B is directed toward the rear from the battery 60, and therefore a flow of hot air from the engine 26A toward the battery 60 located on the front is preventable. Accordingly, a temperature rise of the battery 60 is avoidable.

Furthermore, the second air outlet port 84B of the second pipe 84 overlaps the battery 60 in a side view (see FIG. 14), and is positioned at substantially the same height as the height of the battery 60. The second air outlet port 84B of the second pipe 84 faces the engine 26A located below the second air outlet port 84B. Air flowing from the transmission chamber 26C is directed toward the engine 26A from the height of the battery 60, wherefore a rising flow of hot air from the engine 26A toward the battery 60 is preventable.

In addition, air flowing from the first air outlet port 84A is directed downward from above the exhaust pipe 28, and therefore an upward flow of heat from the exhaust pipe 28 is preventable. In this manner, the air having cooled the transmission chamber 26C releases heat generated from the engine 26A and the exhaust pipe 28 downward. Accordingly, a temperature rise of the battery 60 is avoidable.

The first pipe 82 and the second pipe 84 are disposed around the battery 60. The first pipe 82 is a pipe through which the outside air for cooling the transmission chamber 26C passes, while the second pipe 84 is a pipe through which air having passed through the transmission chamber 26C passes. The temperature of the air having passed through the transmission chamber 26C is lower than the ambient temperature of the engine 26A. Accordingly, the ambient temperature of the battery 60 is lowered by the outside air temperature, or the temperature of the transmission chamber 26C lower than the ambient temperature of the engine 26A.

Figure 12:
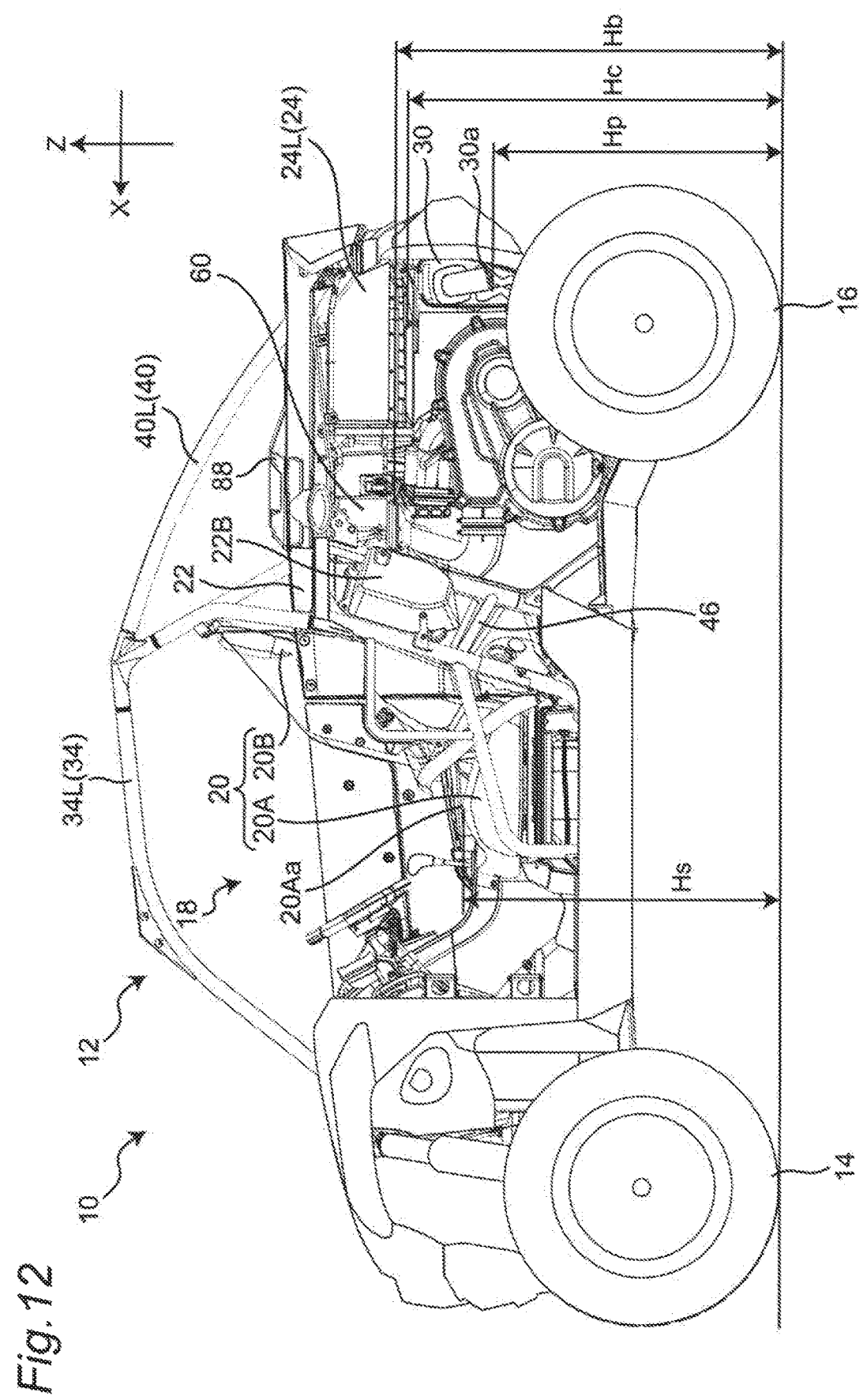
FIG. 12 is a left side view of the utility vehicle from which the left side cover is removed.

Now refer to FIG. 12. FIG. 12 is a left side view of the utility vehicle 10 from which the side cover 70, the first pipe 82, and the left door 19 are removed. A height Hb from the ground to the lower surface of the battery 60 is larger than a height Hp from the ground to the lower end of an air outlet port 30a of the silencer 30. The height Hb is also larger than a height Hs from the ground to an upper end 20Aa of the seat cushion 20A of the seat 20, and larger than a height Hc from the ground to the lower end of the carrier 24. A relationship of Hb>Hc>Hs>Hp holds in the heights.

The driver tends highly not to enter a river having such a depth at which the seating surface of the seat cushion 20A is immersed in water to avoid such a situation that the seating surface of the seat cushion 20A is drenched. Accordingly, in the arrangement that the battery 60 is located at a position higher than the upper end 20Aa of the seat cushion 20A, water resistance improves without a necessity of taking measures for waterproofing of the battery 60. In addition, corrosion caused by water for a harness, electric wires, and the like connected to the battery 60 can decrease. Moreover, in the arrangement that the battery 60 is mounted at a higher position from the ground as described above, direct adhesion of water and dust to the battery 60, caused when the water and dust are raised by a tire rotation of the rear wheels 16, can decrease. Furthermore, in the arrangement that the battery 60 is located higher than the seating surface of the seat cushion 20A, accessibility to the battery 60 improves.

In addition, the driver tends not to enter a river having a depth at which the carrier 24 is immersed in water to avoid such a situation that a load placed on the carrier 24 is drenched. The battery 60 is disposed above the lower end of the carrier 24. In this case, even if the utility vehicle 10 enters a river, the battery 60 is difficult to drench with water. Accordingly, water resistance can improve. In addition, in a state that the upper cover 72 is removed, the user can access the battery 60 in a standing posture. Accordingly, maintainability can further improve.

Furthermore, the silencer 30 connected to the exhaust pipe 28 is disposed immediately below a rear portion of the carrier 24. In this arrangement, the battery 60 disposed forward of the carrier 24 is located away from the silencer 30. Accordingly, effect of heat of the silencer 30 on the battery 60 is preventable.

Now refer to FIG. 10. FIG. 10 is a right rear perspective view of a main part around the battery 60 and the power unit 26. The outside air is introduced into the air cleaner box 86 through an air intake duct 92 (FIG. 11) inserted into a right air intake cover 90. A filter is disposed within the air cleaner box 86 to purify the introduced outside air. The outside air purified at the air cleaner box 86 passes through an air intake pipe 94 and is fed to the engine 26A of the power unit 26. Meanwhile, the exhaust pipe 28 through which exhaust gas discharged from the engine 26A passes includes an exhaust manifold portion 28A connected to the engine 26A, and an exhaust pipe 28B connected to the exhaust manifold portion 28A. The rear end of the exhaust pipe 28B is connected to the silencer 30.

A positive terminal 60A of the battery 60 is connected to the power generator 26D (see FIG. 25) via a harness. The positive terminal 60A is further connected to a harness bundled in a main harness 126 extending to an electrical component box 98. A negative terminal 60B of the battery 60 is connected to the middle cross member 36B via a harness to be body-grounded.

Figure 13:
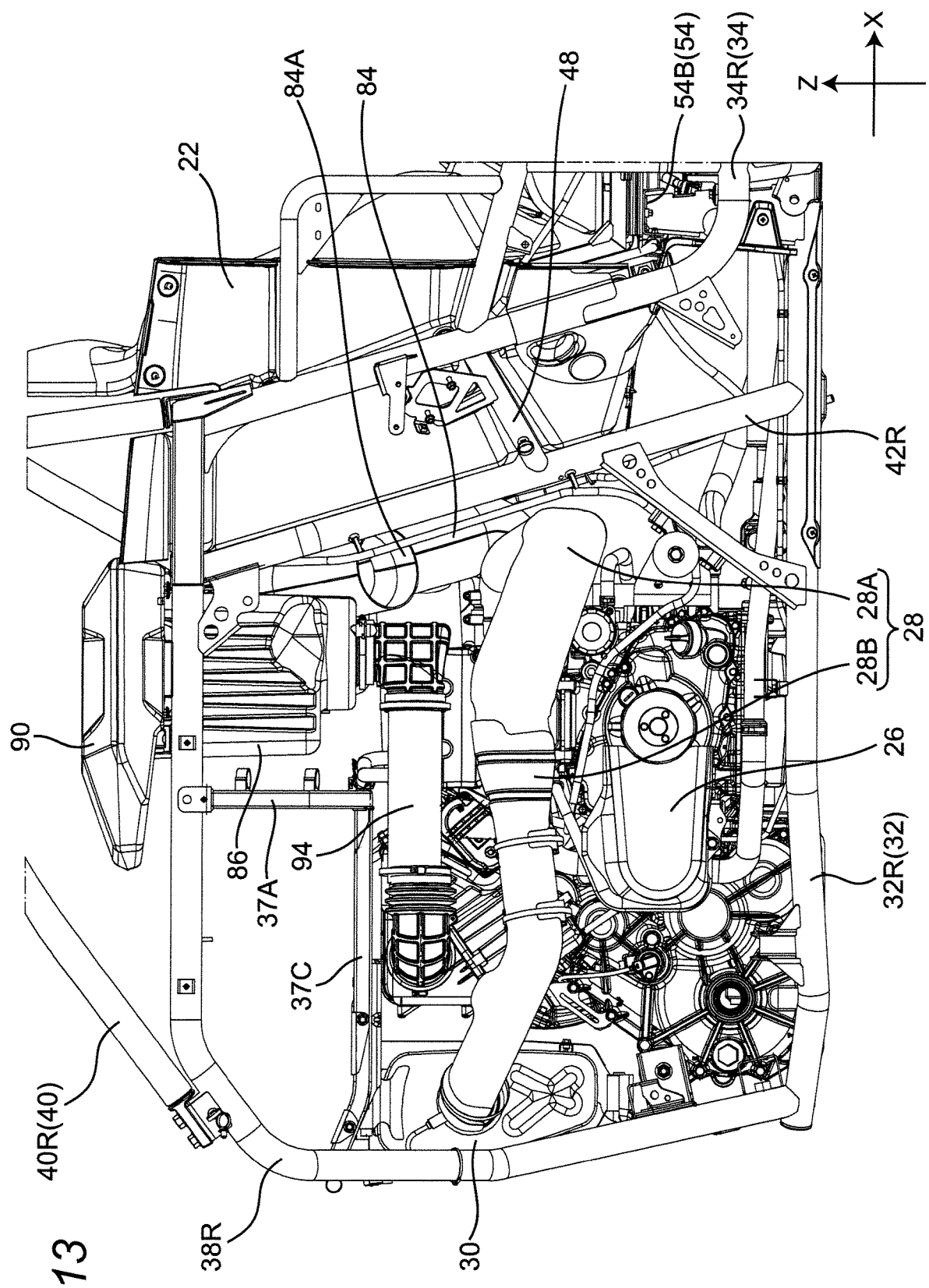
FIG. 13 is a right side view of a main part around the power unit.

Now refer to FIG. 13. FIG. 13 is a right side view of a main part around the power unit 26. The air intake pipe 94 is disposed between the exhaust pipe 28 and the air cleaner box 86 in a side view. The battery 60 is disposed on the side opposite to the air cleaner box 86 in the vehicle width direction. High-temperature exhaust gas discharged from the engine 26A flows through the exhaust pipe 28. However, in the arrangement that the battery 60 and the exhaust pipe 28 are sufficiently separated from each other, direct transmission of heat from the exhaust pipe 28 to the battery 60 can decrease.

Figure 14:
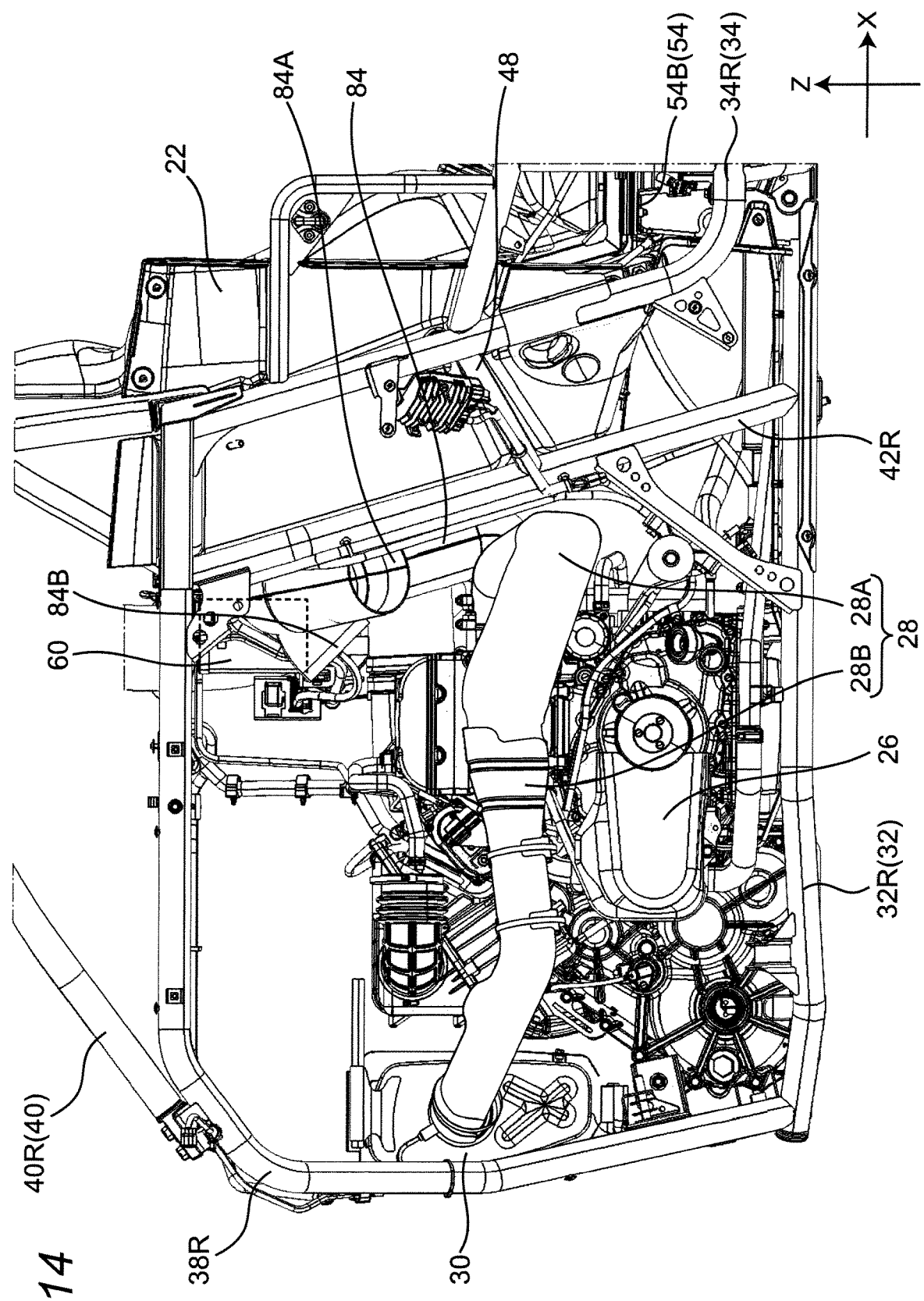
FIG. 14 is a right side view of the main part around the power unit from which the air cleaner box and an intake pipe shown in FIG. 13 are removed.
Figure 15:
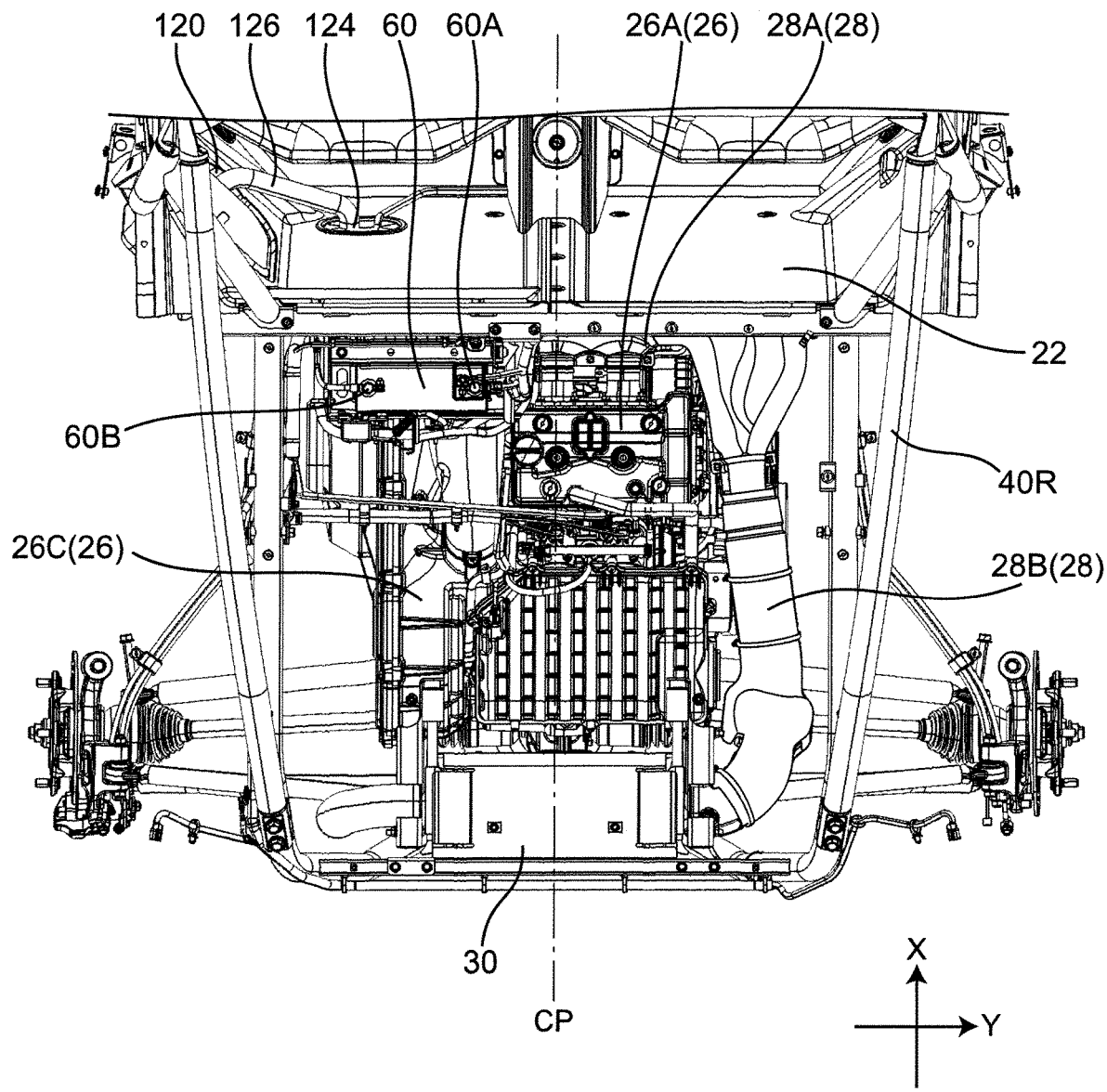
FIG. 15 is a top view of the main part around the power unit.

Now refer to FIGS. 14 and 15 as well. FIG. 14 is a right side view of the main part around the power unit 26 and does not show the air cleaner box 86 and the air intake pipe 94. FIG. 15 is a top view of the main part around the power unit 26. The power unit 26 is disposed behind the back panel 22 and below the battery 60. The exhaust manifold portion 28A extends in a direction opposite to the battery 60 in the vehicle width direction from a connection portion with the engine 26A, and further extends rearward on one side of the utility vehicle 10 on the side opposite to the battery 60 with respect to a vehicle width direction center plane CP. The exhaust pipe 28B connected to the exhaust manifold portion 28A also extends rearward on the one side of the utility vehicle 10 on the side opposite to the battery 60 with respect to the vehicle width direction center plane CP.

The battery 60 and the exhaust pipe 28 are disposed on the sides opposite to each other with respect to the vehicle width direction center plane CP. In this arrangement, the battery 60 and the exhaust pipe 28 are disposed away from each other, and therefore effect of heat of the exhaust pipe 28 on the battery 60 can decrease.

Figure 16:
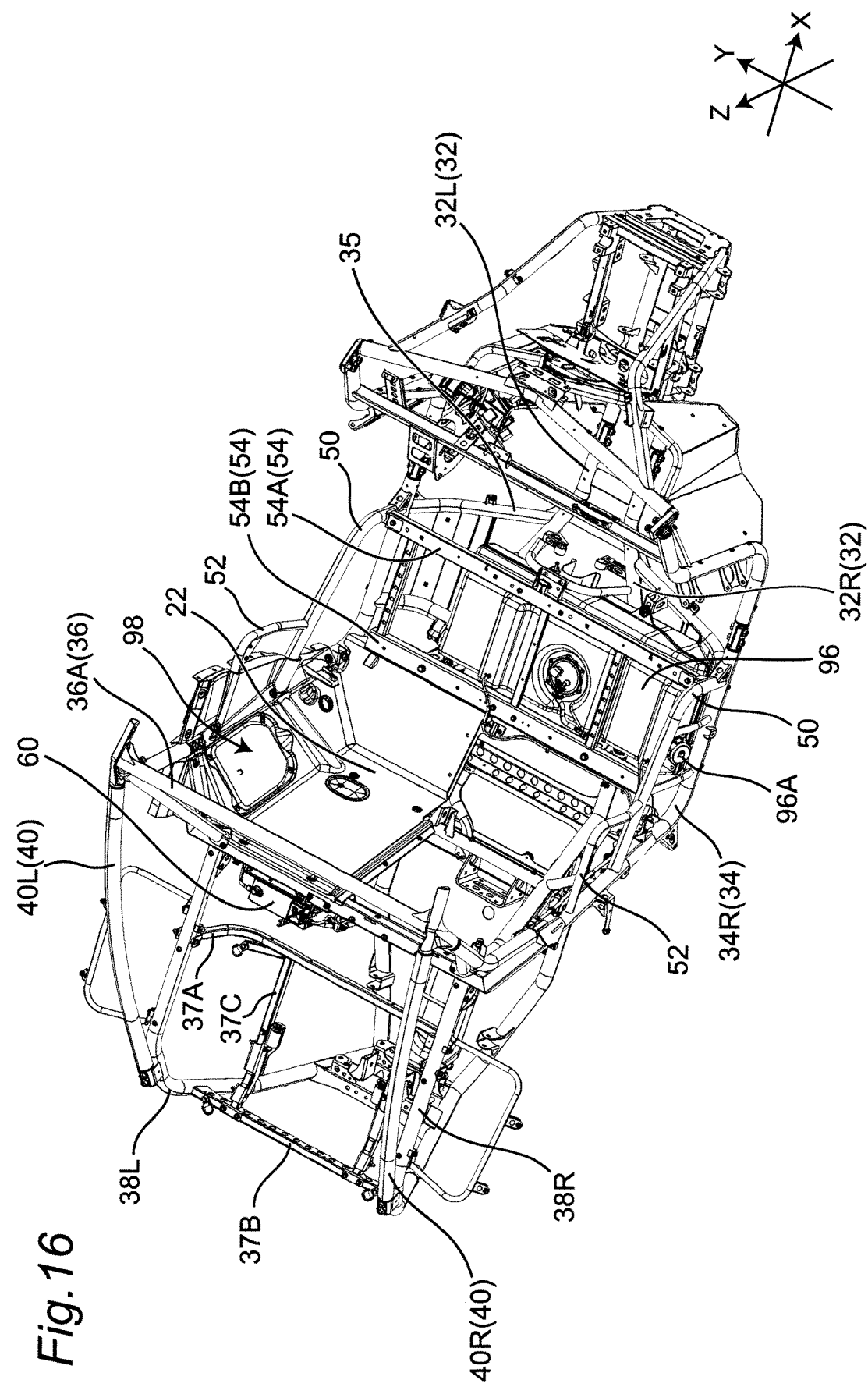
FIG. 16 is a front perspective view illustrating a part of the vehicle body frame of the utility vehicle.
Figure 17:
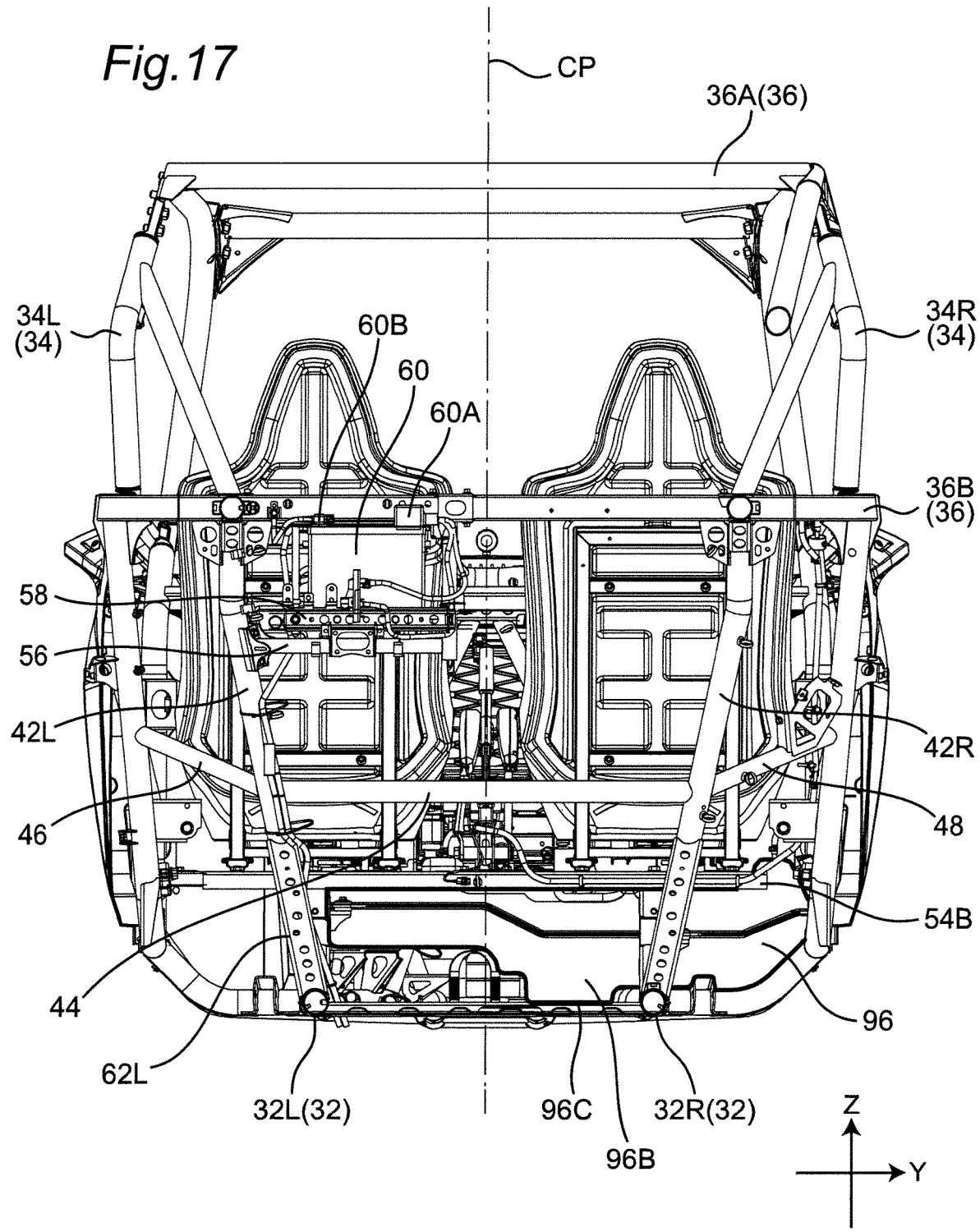
FIG. 17 is a view illustrating a positional relationship between the battery and a fuel tank as viewed forward from a transverse cross section of the utility vehicle.

Now refer to FIGS. 16 and 17. FIG. 16 is a front perspective view of a part of the vehicle body frame of the utility vehicle. FIG. 17 is a view illustrating a positional relationship between the battery 60 and a fuel tank 96 as viewed forward from a transverse cross section of the utility vehicle 10. The utility vehicle 10 includes the fuel tank 96 disposed below the seat 20. The fuel tank 96 is supported by the left main frame 32L, the front seat frame 54A, and the rear seat frame 54B. A fuel filler port 96A (see FIG. 4) of the fuel tank 96 is so disposed as to face outward in the vehicle width direction.

The battery 60 is disposed on the side opposite to a protrusion 96B, which protrudes downward from the fuel tank 96, with respect to the vehicle width direction center plane CP. The protrusion 96B is disposed on the fuel filler port 96A side with respect to the vehicle width direction center plane CP, in such a shape as to protrude vertically downward. A drive shaft passes through a lower portion of the fuel tank 96. Accordingly, a lower end portion 96C of the fuel tank 96 is disposed on the fuel filler port 96A side with respect to the vehicle width direction center plane CP. The lower end portion 96C of the protrusion 96B corresponds to a lower end portion of the fuel tank 96. Accordingly, efficient mixture between fuel newly supplied from the fuel filler port 96A, and fuel remaining in the lower end portion 96C is achievable.

The fuel tank 96 has a substantially rectangular shape having long sides extending in the vehicle width direction in a top view. In addition, the fuel tank 96 has the protrusion 96B protruding downward in a rear view. The protrusion 96B has a height of approximately ⅓ of the total height of the fuel tank 96. The lower end portion 96C of the protrusion 96B protruding downward is disposed on the fuel filler port 96A side. Accordingly, at least the half or more of the volume of the fuel tank 96 is disposed on the side opposite to the battery 60 with respect to the center plane CP. The fuel tank 96 containing fuel therefore has a center of gravity on the side opposite to the battery 60 with respect to the center plane CP. In the foregoing arrangement that the battery 60 is located on the side opposite to the protrusion 96B protruding downward from the fuel tank 96 with respect to the center plane CP, weight unbalance between the right and left sides of the utility vehicle 10 can decrease.

Figure 18:
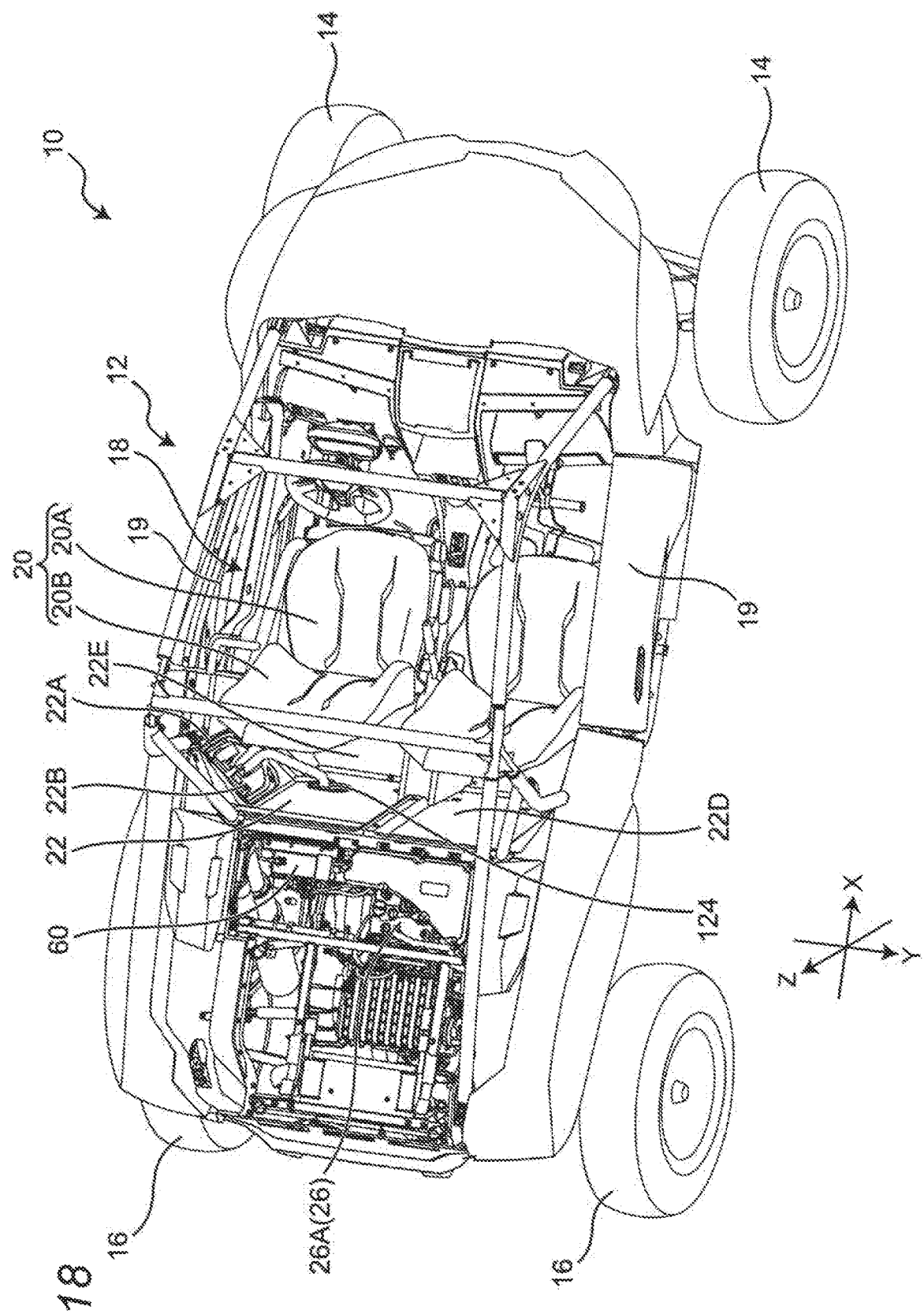
FIG. 18 is a right rear perspective view of the utility vehicle from which a lid of an electrical component box is removed.
Figure 19:
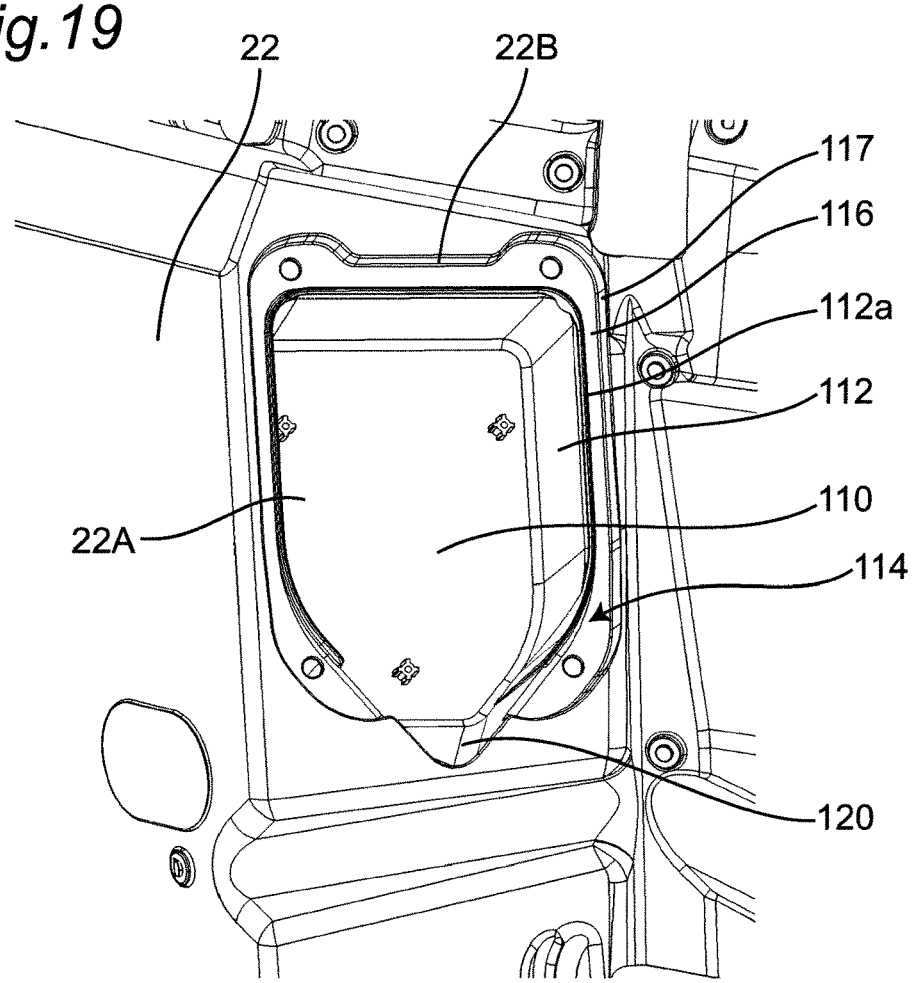
FIG. 19 is a partial view of a back panel around the electrical component box.
Figure 20:
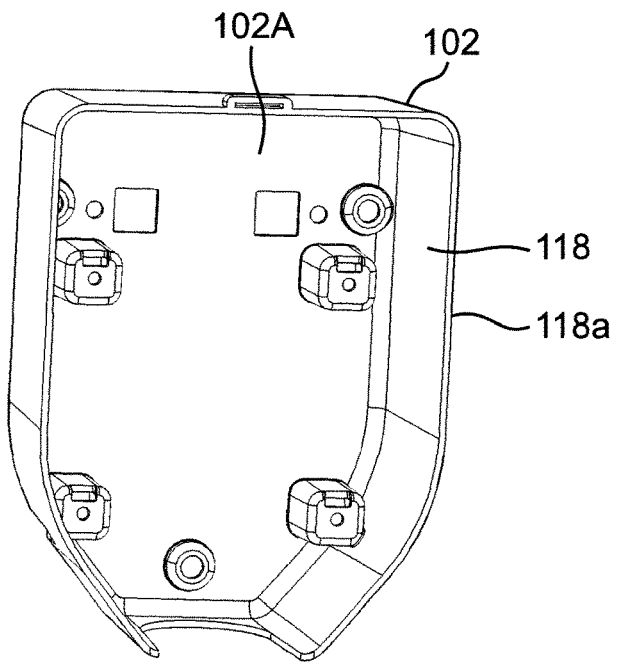
FIG. 20 is a front perspective view of a case body.
Figure 21:
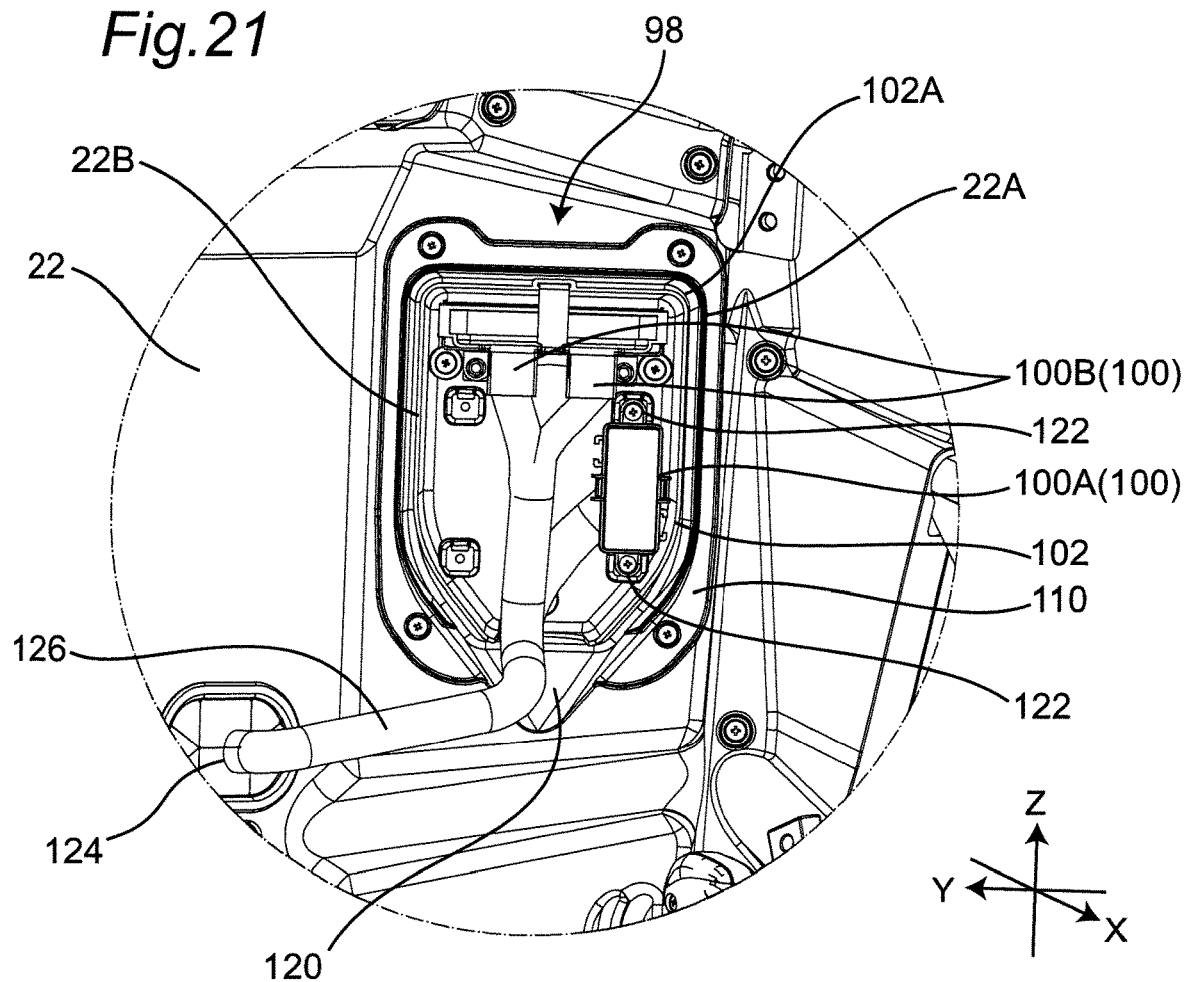
FIG. 21 is a front view around the electrical component box from which the lid is removed.

Described now with reference to FIG. 1 and FIGS. 18 to 21 is the electrical component box 98 that houses electrical components connected to various electric parts included in the utility vehicle 10 via a harness. FIG. 18 is a right rear perspective view of the utility vehicle 10 from which a lid 22C of the electrical component box 98 is removed. FIG. 19 is a partial view of a back panel around the electrical component box. FIG. 20 is a front perspective view of a case body. FIG. 21 is a front view around the electrical component box 98 from which the lid 22C is removed. The electrical component box 98 is formed in the back panel 22.

A box portion 22B having an opening 22A on the cabin 18 side (i.e., facing the cabin 18) is formed in a part of the back panel 22. The utility vehicle 10 includes a lid 22C covering the opening 22A, and electrical components 100 housed in the box portion 22B. Note that the box portion 22B may be formed on a lower wall 22E instead of a side wall 22D of the back panel 22. The utility vehicle 10 further includes a case body 102 fixed to the inside of the box portion 22B. The electrical component box 98 is constituted by the box portion 22B, the case body 102, and the lid 22C.

In the arrangement that the box portion 22B having the opening 22A on the cabin 18 side is formed in a part of the back panel 22, the electrical component box 98 which houses the electrical components 100 is allowed to be disposed in the cabin 18. For example, the electrical components 100 includes an electronic control unit (ECU) 100A which controls the engine 26A, and a relay 100B which connects and disconnects between a harness from the battery 60 and a headlight 134 and a taillight 130. For example, the electrical components 100 include a fuse, a breaker, and a terminal. The interior of the cabin 18 is a space where the driver and the occupant are present, and is located in a relatively clean environment in the utility vehicle 10. In the arrangement that the electrical component box 98 is disposed in the cabin 18 thus formed, entrance of water and dust into the electrical component box 98 can decrease.

The box portion 22B is formed on the side wall 22D of the back panel 22 facing the rear surface of the backrest 20B of the seat 20. The opening 22A of the box portion 22B faces the rear surface of the seat 20, and is extended in the longitudinal direction. Accordingly, even if water enters the box portion 22B through the lid 22C covering the opening 22A of the box portion 22B, the water drops along the opening 22A of the box portion 22B by gravity. Accordingly, entrance of water into the horizontally inside with respect to the opening 22A of the box portion 22B is preventable. In this manner, more reduction of entrance of water and dust into the box portion 22B is achievable than in such a configuration where the opening 22A of the box portion 22B faces upward.

As illustrated in FIG. 12, the box portion 22B is at a height level above a height level of an upper end 20Aa of the seating surface of the seat cushion 20A of the seat 20. In this case, the electrical component box 98 is brought into sufficient contact with the outside air flowing inside the cabin 18. In addition, wind can easily pass therethrough, and heat does not stay within the electrical component box 98. For example, in a configuration where the box portion 22B is provided inside a console 104 (see FIG. 2) disposed at a lower portion of the cabin 18, hot air coming from a radiator and passing through the inside of the console 104 tends to be trapped thereat. In this case, measures against heat need to be taken for the box portion. Moreover, the inside of the console 104 where a drive shaft passes is not a clean environment. According to the present embodiment, however, the electrical component box 98 is disposed within the cabin 18, and the box portion 22B is brought into sufficient contact with the outside air. Accordingly, measures against heat need not be taken for the electrical component box 98.

Figure 23:
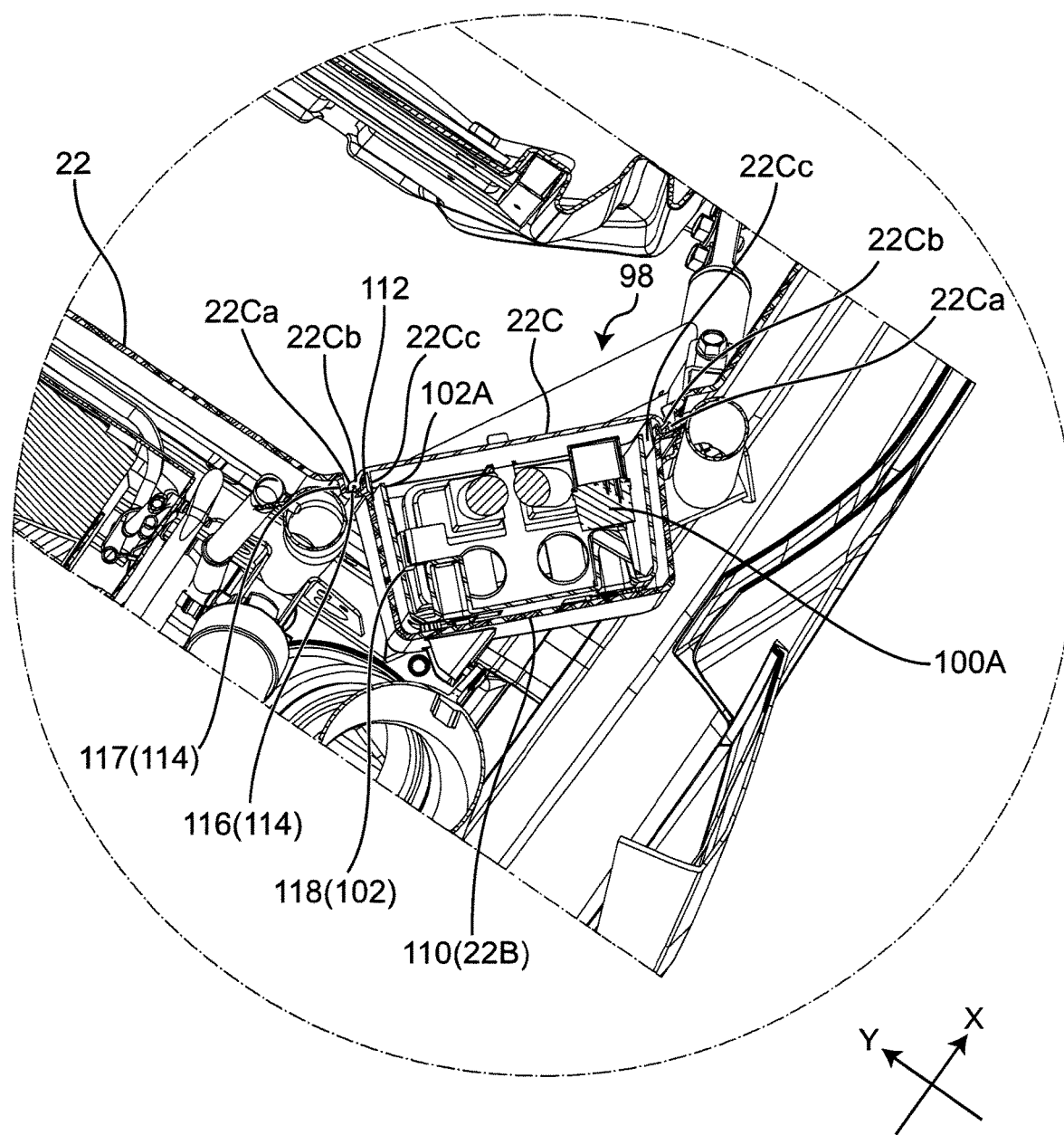
FIG. 23 is a view as viewed upward from a transverse cross section around the electrical component box.
Figure 24:
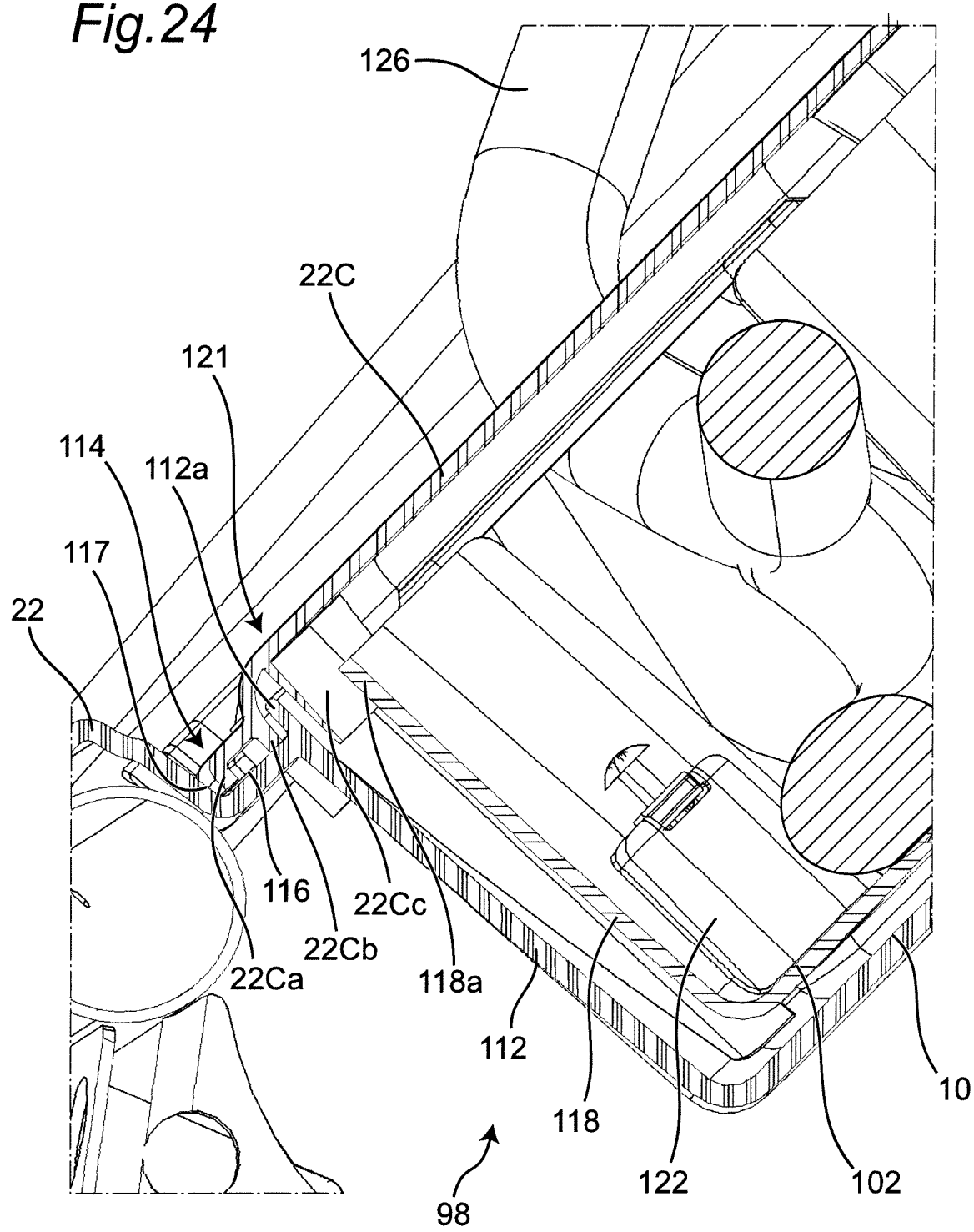
FIG. 24 is a partial enlarged view of the electrical component box.

As illustrated in FIG. 21, the box portion 22B has a downwardly tapered shape in a front view. Moreover, as illustrated in FIGS. 23 and 24, the box portion 22B includes a bottom portion 110, a side wall portion 112 extending from the bottom portion 110 toward the opening 22A, and a recess 114 into which the lid 22C is fitted along the opening 22A on the outside of an end portion 112a of the side wall portion 112. The end portion 112a of the side wall portion 112 forming the inner wall of the recess 114 protrudes from a bottom portion 116 of the recess 114. Meanwhile, a side wall portion 117 forming the outer wall of the recess 114 is continuous with the back panel 22.

Figure 22:
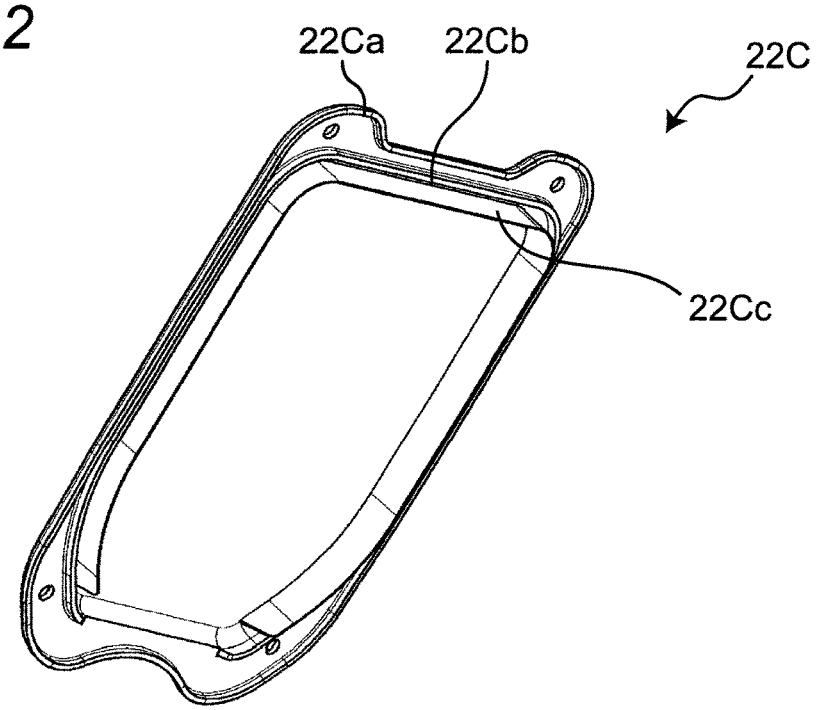
FIG. 22 is a rear perspective view of the lid.

As illustrated in FIGS. 22 and 23, the lid 22C includes a first wall portion 22Ca formed along the outer periphery of the lid 22C, a second wall portion 22Cb formed along the outer side surface of the side wall portion 112 of the box portion 22B inside the first wall portion 22Ca, and a third wall portion 22Cc formed inside the second wall portion 22Cb along the inner side surface of the side wall portion 112 of the box portion 22B. Note that each of the second wall portion 22Cb and the third wall portion 22Cc is not formed in a part of a lower portion of the lid 22C, producing a discontinuous part. In addition, the length of the third wall portion 22Cc in the depth direction is larger than each length of the first wall portion 22Ca and the second wall portion 22Cb in the depth direction.

The volume of the case body 102 is smaller than the volume of the box portion 22B. The case body 102 has an opening 102A extended in a same direction as the direction of the opening 22A of the box portion 22B. The case body 102 houses the electrical components 100, while the lid 22C covers the opening 102A of the case body 102. The case body 102 is housed and fixed in the box portion 22B. The entire opening 22A of the box portion 22B is covered by the lid 22C from the front. The electrical component box 98 therefore has a double structure which can further improve waterproofing.

The first wall portion 22Ca and the second wall portion 22Cb of the lid 22C are fitted into the recess 114 of the box portion 22B. The side wall portion 112 of the box portion 22B is further fitted between the second wall portion 22Cb and the third wall portion 22Cc of the lid 22C. As illustrated in FIG. 24, the third wall portion 22Cc of the lid 22C is disposed between an end portion 118a of a side wall portion 118 of the case body 102 on the opening 102A side, and the end portion 112a of the side wall portion 112 of the box portion 22B.

In this manner, a connection portion 121 between the lid 22C and the respective openings 22A and 102A of the box portion 22B and the case body 102 has a labyrinth structure constituted by the first wall portion 22Ca and the second wall portion 22Cb of the lid 22C, the side wall portion 112 of the box portion 22B, and the side wall portion 118 of the case body 102. The connection between the box portion 22B, the case body 102, and the lid 22C by the labyrinth structure further improves waterproofing.

In this case, water having fallen on the electrical component box 98 needs to pass along this labyrinth structure before entering the electrical component box 98. However, most of the water drops by the own weight of the water through the first wall portion 22Ca, the second wall portion 22Cb, and the third wall portion 22Cc of the lid 22C, the side wall portion 112 of the box portion 22B, and the outer peripheral side of the side wall portion 118 of the case body 102. Accordingly, entrance of the water into the case body 102 is preventable.

A hole 120 (see FIG. 15) through which the main harness 126 is inserted into the box portion 22B is formed in a lower portion of the box portion 22B. Meanwhile, water having entered the inside of the lid 22C drops along the respective wall portions of the lid 22C, and is discharged to the outside from the hole 120.

Figure 25:
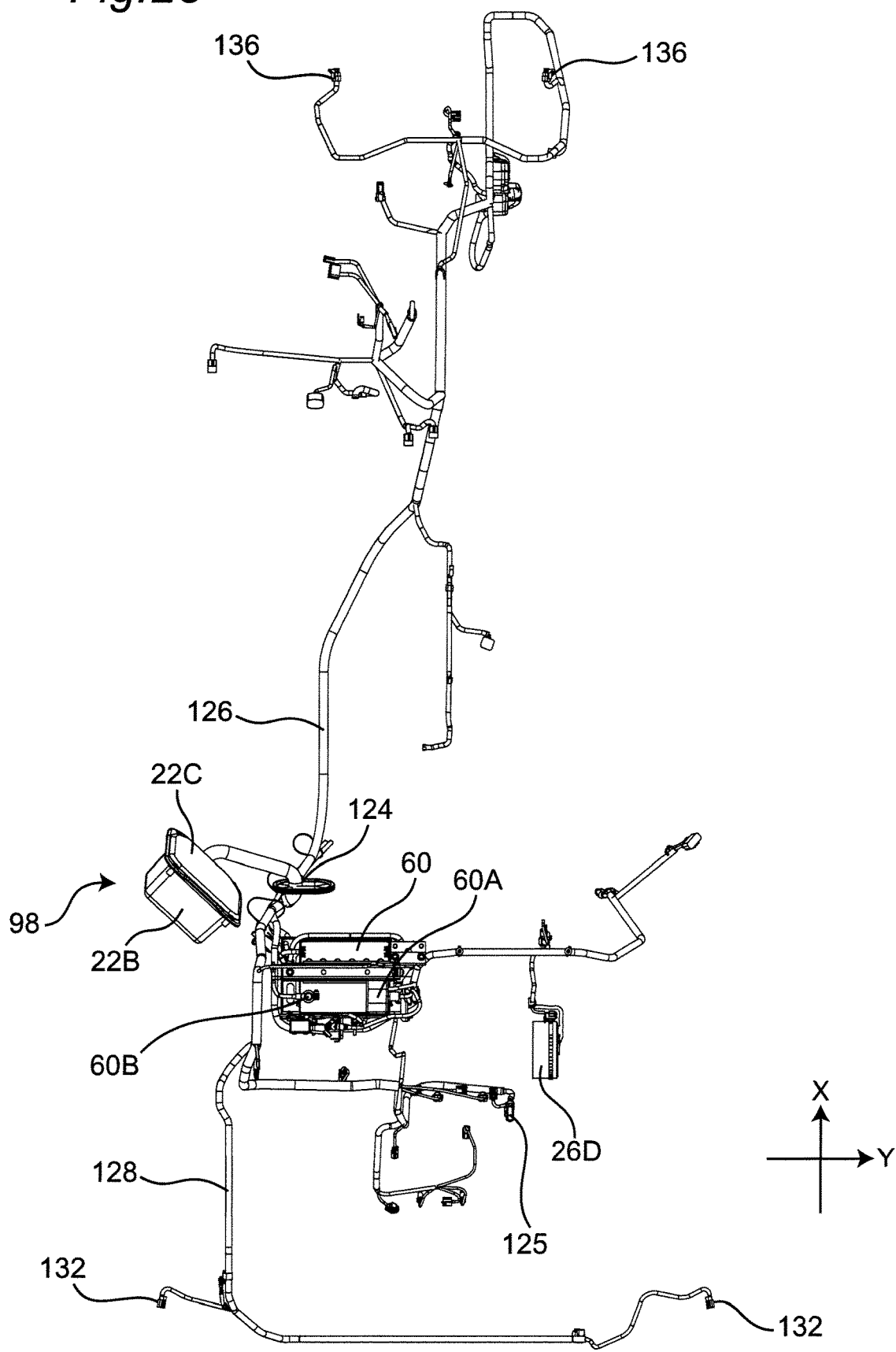
FIG. 25 is a top view of a harness, the battery, and the electrical component box.

The ECU 100A is fixed to two pillar portions 122 protruding forward from the case body 102. The main harness 126 extends from the ECU 100A, passes through the hole 120 and a hole 124 (see FIG. 21) formed in the back panel 22, and further extends rearward as illustrated in FIG. 25 to be connected to a fuel injection device 125 of the engine 26A, a regulator rectifier, and various sensors such as a rollover sensor and an intake air temperature sensor. In addition, a sub harness 128 branched from the main harness 126 has a taillight connection terminal 132 connected to the taillight 130 of the utility vehicle 10. The main harness 126 also connected to the battery 60 has a headlight connection terminal 136 extending forward via the relay 100B and connected to the headlight 134 of the utility vehicle 10.

In the arrangement that the battery 60 is located behind the back panel 22, the distance between the battery 60 and the electrical component box 98 can be decreased, and the harness from the battery 60 to the electrical component box 98 can be decreased.

Electric parts connected to the battery 60 via the relay 100B need a harness connected from the battery 60 to the relay 100B disposed within the electrical component box 98, and further a harness from the relay 100B to the electric parts. Particularly, in a conventional configuration of the taillight 130 disposed in a rear portion of the utility vehicle 10, a main harness is provided from a battery disposed in a rear portion of a cabin to an electrical component box disposed forward of the cabin. Moreover, a sub harness is further provided from the electrical component box disposed forward of the cabin to the taillight 130. In this case, a surplus length of the harness round-trip in the front-rear direction of the utility vehicle 10 is required. According to the present embodiment, however, the electrical component box 98 and the battery 60 are disposed with the back panel 22 interposed therebetween. Accordingly, the length of the harness can be made shorter than the length of the harness in the configuration where the electrical component box 98 is disposed forward of the cabin 18.

According to the utility vehicle 10, the ECU 100A is disposed within the box portion 22B, while the power unit 26 is disposed behind the back panel 22. In this case, the distance from the electrical component box 98 to the engine 26A is short, and therefore the distance of the harness from the ECU 100A to the engine 26A can be reduced. In a conventional arrangement where the ECU 100A and the engine 26A are disposed with the cabin 18 interposed therebetween, a long harness is required. According to the present embodiment, however, the ECU 100A disposed in the rear portion of the cabin 18 and the engine 26A disposed behind the cabin 18 are connected by the main harness 126. Accordingly, the length of the harness decreases.

The embodiment has been described by way of example of the technology of the present invention. The accompanying drawings and detailed description have been presented for this purpose. Accordingly, some of the constituent elements described in the accompanying drawings and the detailed description may include not only essential constituent elements for solving problems, but also constituent elements which are not essential for solving problems. It should not be therefore recognized that these not-essential components are imperative based on only consideration that the not-essential components are depicted and described in the accompanying drawings and detailed description.

Furthermore, various changes, substitutions, additions, omissions, and the like within the scope of the appended claims or an equivalent thereof may be made for the embodiment described herein by way of example of the technology of the present invention.

The invention claimed is:

1. A utility vehicle comprising:
   a seat;
   a back panel, at least a part of the back panel being located behind the seat, the back panel having a box portion with an opening facing a cabin;
   a lid that covers the opening; and
   an electrical component housed in the box portion.

2. The utility vehicle according to claim 1, wherein the box portion is on a side wall of the back panel facing a back surface of the seat.

3. The utility vehicle according to claim 1, wherein the box portion is at a level above a seating surface of the seat.

4. The utility vehicle according to claim 1, further comprising a case body fixed to an inside of the box portion, wherein:
   the case body has an opening facing in a same direction as the opening of the box portion,
   the case body houses the electrical component, and
   the lid covers the opening of the case body.

5. The utility vehicle according to claim 4, wherein a connection portion between the lid and the opening of the box portion and the opening of the case body has a labyrinth structure.

6. The utility vehicle according to claim 1, wherein a battery is behind the back panel.

7. The utility vehicle according to claim 6, further comprising:
   a power unit including an engine and a power generator for generating power from an output of the engine; and
   an electronic control unit (ECU) within the box portion, wherein the power unit is behind the back panel.

* * * * *